(12) United States Patent
Khalil et al.

(10) Patent No.: US 11,302,609 B2
(45) Date of Patent: Apr. 12, 2022

(54) RADIO FREQUENCY POWER DIES HAVING FLIP-CHIP ARCHITECTURES AND POWER AMPLIFIER MODULES CONTAINING THE SAME

(71) Applicant: NXP USA, Inc., Austin, TX (US)

(72) Inventors: Ibrahim Khalil, Gilbert, AZ (US); Charles John Lessard, Gilbert, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/007,175

(22) Filed: Aug. 31, 2020

(65) Prior Publication Data

US 2022/0068767 A1    Mar. 3, 2022

(51) Int. Cl.
*H01L 23/482* (2006.01)
*H01L 23/433* (2006.01)
*H01L 27/088* (2006.01)

(52) U.S. Cl.
CPC ...... *H01L 23/4824* (2013.01); *H01L 23/4334* (2013.01); *H01L 27/088* (2013.01)

(58) Field of Classification Search
CPC ............. H01L 23/4334; H01L 23/4824; H01L 27/088
See application file for complete search history.

(56) References Cited

U.S. PATENT DOCUMENTS

| | | | |
|---|---|---|---|
| 6,166,436 A | 12/2000 | Maeda et al. | |
| 6,969,909 B2 | 11/2005 | Briere | |
| 9,960,145 B2 | 5/2018 | Costa et al. | |
| 2002/0185675 A1 | 12/2002 | Furukawa | |
| 2012/0267795 A1 | 10/2012 | Shimura | |
| 2015/0340344 A1 | 11/2015 | Lin et al. | |
| 2020/0020632 A1 | 1/2020 | Maeda et al. | |
| 2020/0027850 A1* | 1/2020 | Trang | H01L 23/66 |
| 2020/0176416 A1* | 6/2020 | Ketterson | H01L 23/3128 |
| 2021/0134699 A1* | 5/2021 | Costa | H01L 29/1054 |
| 2021/0313284 A1* | 10/2021 | Noori | H01L 23/66 |

OTHER PUBLICATIONS

U.S. Utility U.S. Appl. No. 16/825,064, filed Apr. 17, 2020; 40 pages.
U.S. Utility U.S. Appl. No. 16/851,895, filed Apr. 17, 2020; 52 pages.

* cited by examiner

*Primary Examiner* — Allan R Wilson

(57) ABSTRACT

Radio frequency (RF) power dies having flip-chip architectures are disclosed, as are power amplifier modules (PAMs) containing such RF power dies. Embodiment of the PAM include a module substrate and an RF power die, which is mounted to a surface of the module substrate in an inverted orientation. The RF power die includes, in turn, a die body having a frontside and an opposing backside, a transistor having active regions formed in the die body, and a frontside layer system formed over the die body frontside. The frontside layer system contains patterned metal layers defining first, second, and third branched electrode structures, which are electrically coupled to the active regions of the transistor. A frontside input/output interface is formed in an outer terminal portion of the frontside layer system and contains first, second, and third bond pads electrically coupled to the first, second, and third branched electrode structures, respectively.

20 Claims, 9 Drawing Sheets

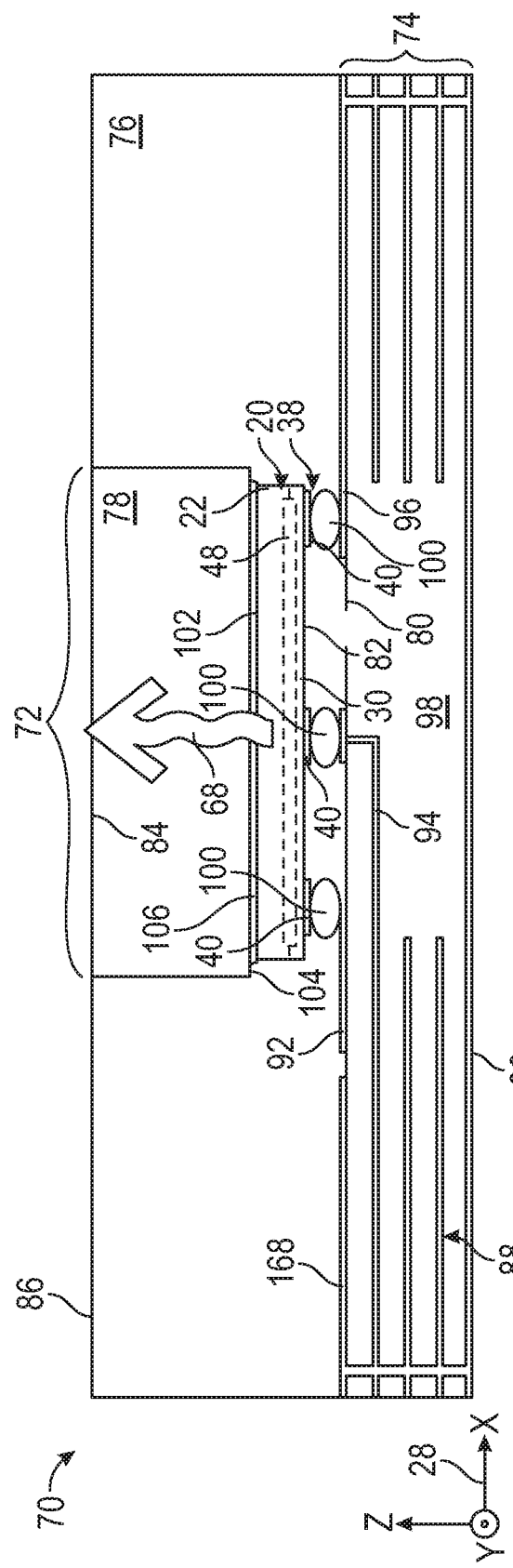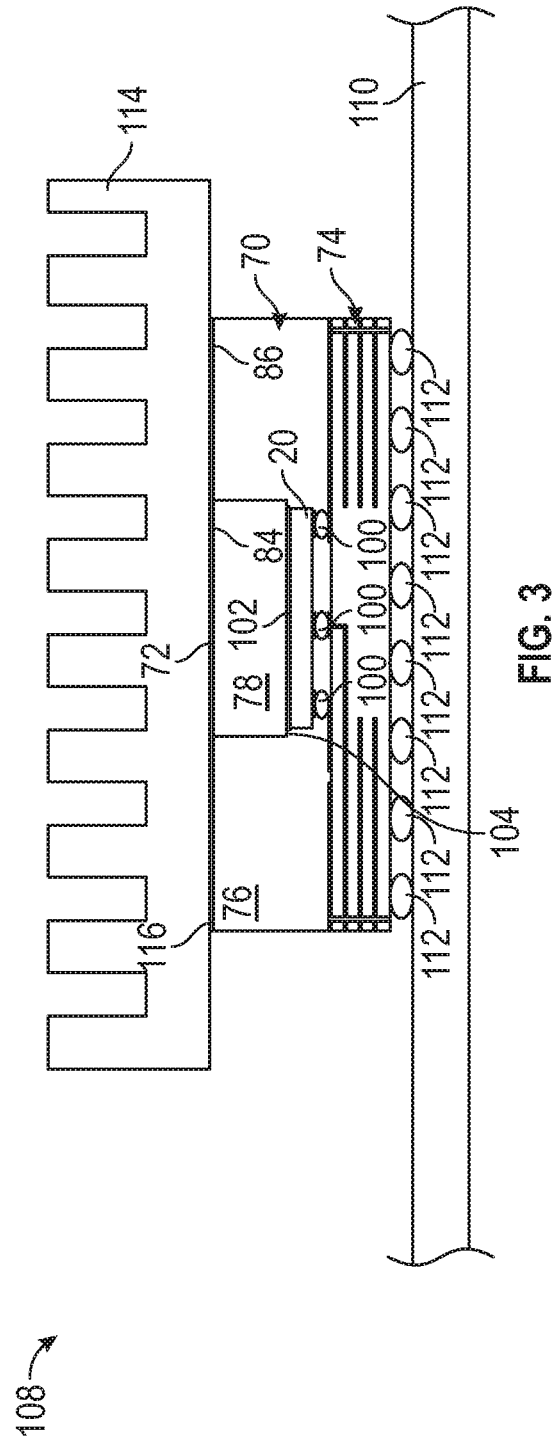

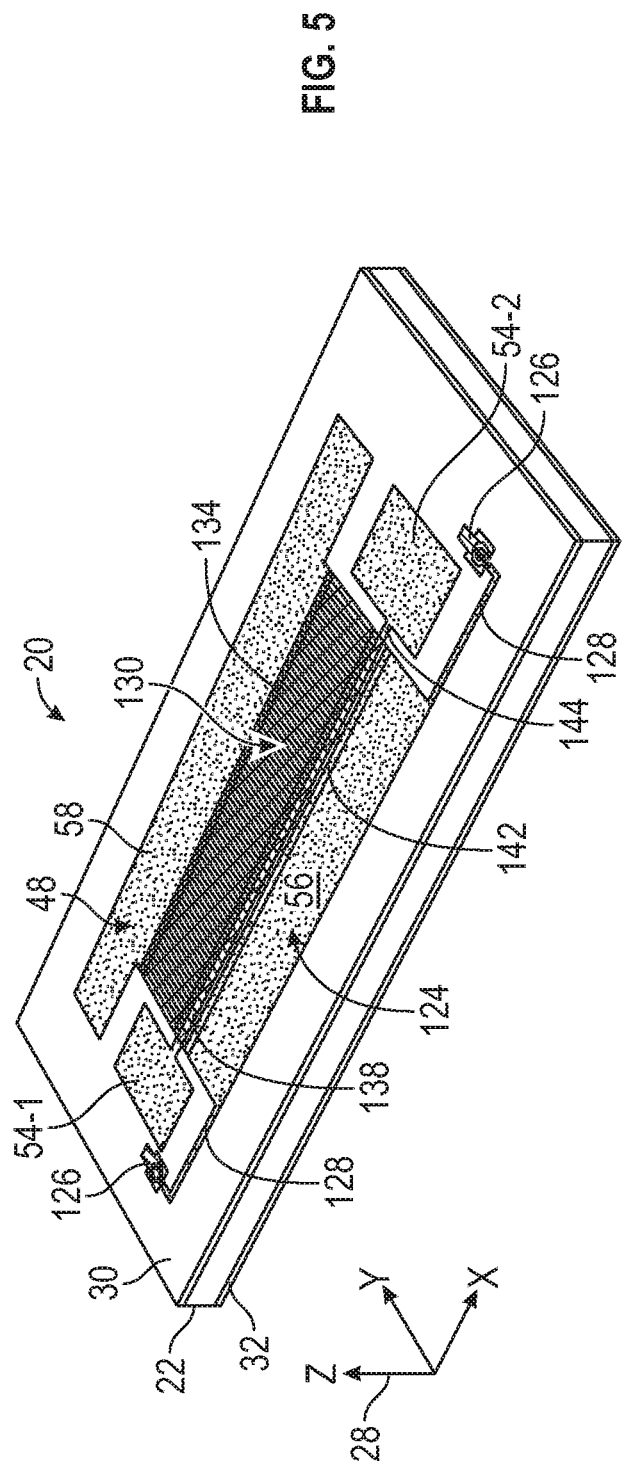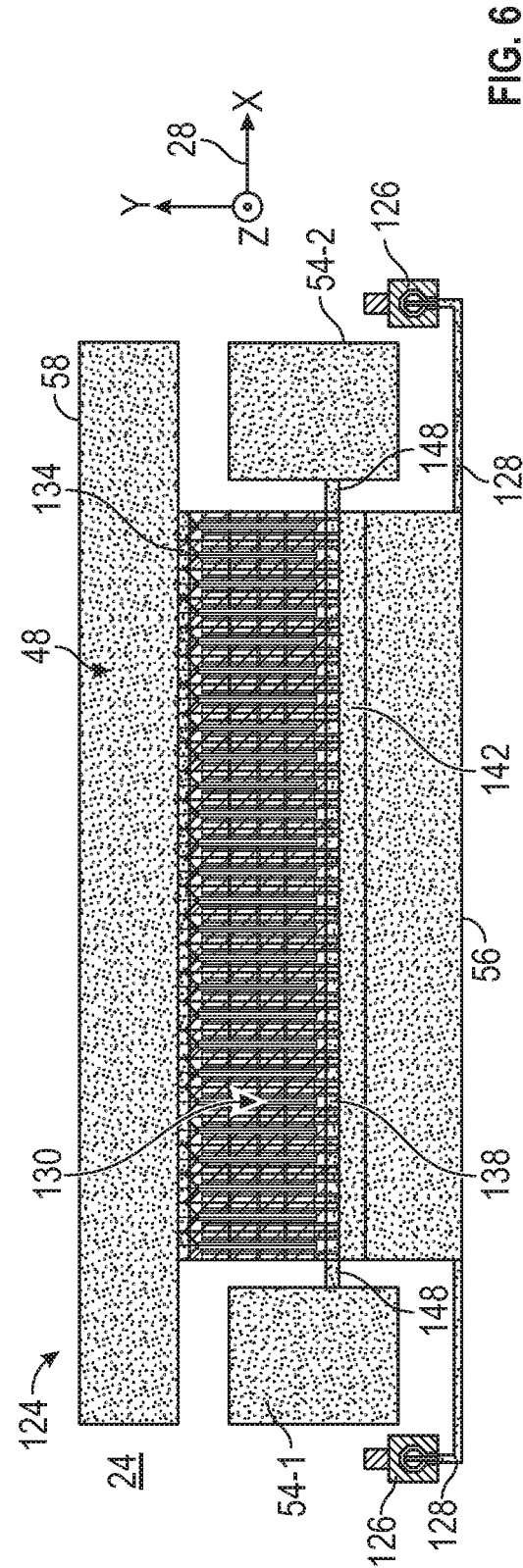

RADIO FREQUENCY POWER DIES HAVING FLIP-CHIP ARCHITECTURES AND POWER AMPLIFIER MODULES CONTAINING THE SAME

TECHNICAL FIELD

Embodiments of the present disclosure relate generally to microelectronics and, more particularly, to radio frequency (RF) power dies having flip-chip architectures and power amplifier modules containing flip-chip RF power dies.

BACKGROUND

A power amplification module (PAM) typically includes a module substrate and at least one radio frequency (RF) power die, which is mounted to the module substrate in an upright or non-inverted orientation. The module substrate may be, for example, a printed circuit board (PCB), a ceramic substrate, or another substrate having electrically-conductive routing features with which the RF power die is electrically interconnected. A given PAM may contain a single RF power die or multiple RF power dies in addition to any number of other microelectronic components, such as discretely-placed capacitors and resistors. The RF power die or dies within a PAM may be prone to excess heat generation during operation, particularly when operated at higher radio frequencies (e.g., frequencies approaching or exceeding 3 Gigahertz) or fabricated utilizing a power dense die technology, such as a layered gallium nitride die structure. By conventional design, an RF power die often includes a metallized backside serving as a backside (e.g., ground) contact of the RF power die, which is electrically coupled to a corresponding terminal of the transistor circuit integrated into the die; e.g., in the case of a field effect transistor (FET), the source terminal of the FET may be electrically coupled to ground through such a backside contact. Contacts to the other terminals of the transistor (e.g., the gate and drain terminals in the case of the FET) may be formed as bond pads located on the frontside of the RF power die and, specifically, formed in an outer terminal surface of a multi-layer system compiled over the frontside of the die body. When installed within a given PAM, wire bonds may be formed between the frontside bond pads and corresponding electrical routing features of the module substrate to complete electrical interconnection of the RF power die.

BRIEF DESCRIPTION OF THE DRAWINGS

At least one example of the present invention will hereinafter be described in conjunction with the following figures, wherein like numerals denote like elements, and:

FIG. 2 is a simplified cross-sectional view of a power amplification module (PAM) containing the flip-chip RF power die shown in FIG. 1, a module substrate to which the RF power die is mounted in an inverted orientation, and a thermal interface exposed along a top surface of the PAM, as illustrated in accordance with an example embodiment of the present disclosure;

FIGS. 3 and 4 are simplified cross-sectional and isometric exploded views, respectively, of a larger electronic assembly (partially shown) into which the example PAM shown in FIG. 2 may be incorporated, while the thermal interface is thermally coupled to an assembly-level heatsink external to the PAM;

FIGS. 5 and 6 are isometric and planform views, respectively, of a transistor layout (here, a field effect transistor structure) suitably integrated into the flip-chip RF power die shown in FIGS. 1-4, as illustrated in accordance with an example embodiment of the present disclosure;

Figure 1:
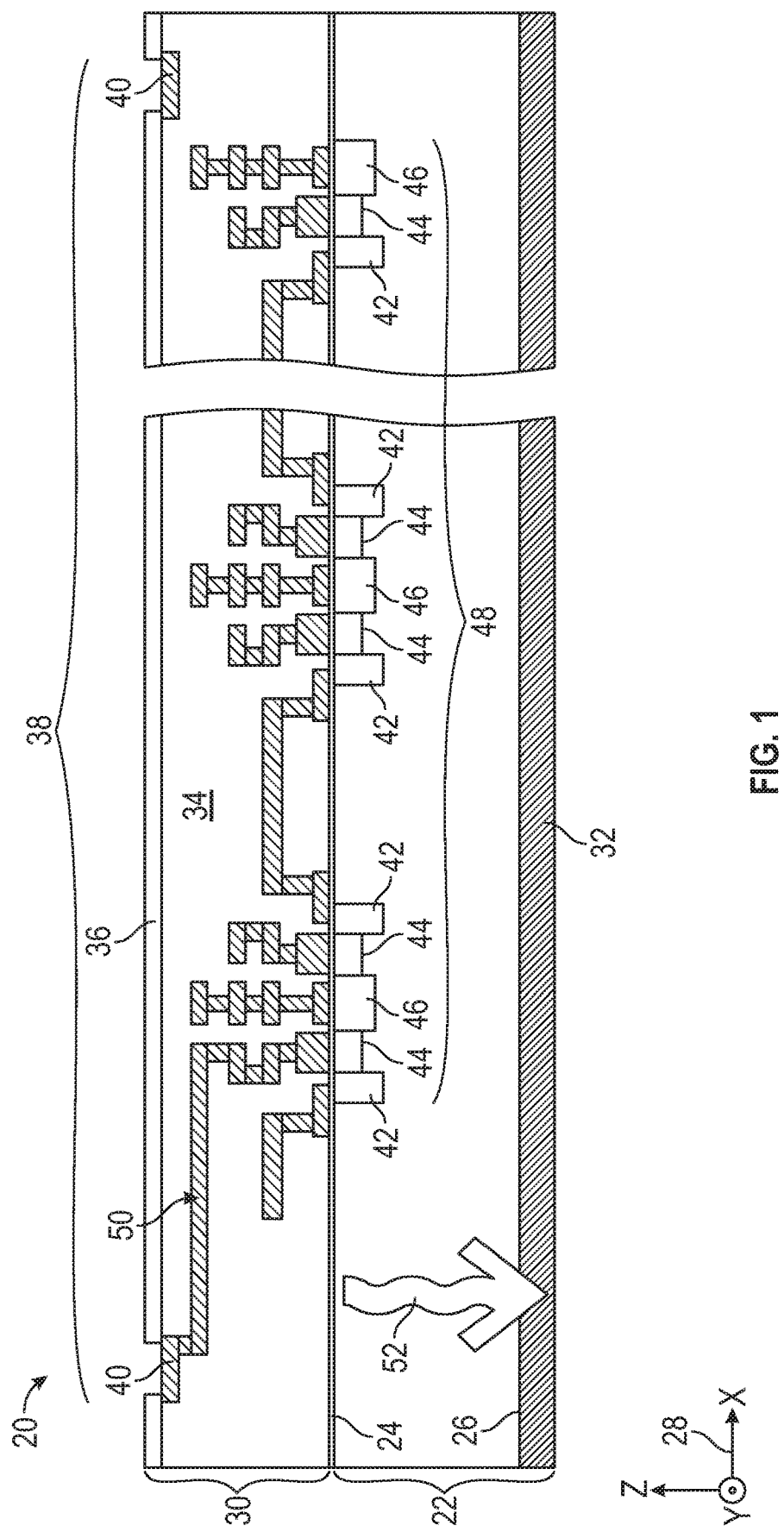
FIG. 1 is a simplified cross-sectional view of a radio frequency (RF) power die having a flip-chip architecture, as depicted in a non-inverted orientation and illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Overview

The following describes radio frequency (RF) power dies having flip-chip architectures, which enable interconnection of transistor current supply, current return, and signal input (control) terminals through a frontside input/output (I/O) interface. Such flip-chip RF power dies are well-suited for incorporation into Power Amplifier Modules (PAMs); the term "power amplification module," as appearing herein, referring to a modular electronic assembly containing at least one RF power die utilized for power or signal amplification purposes. When so incorporated, a given flip-chip RF power die may be mounted to a module substrate of the PAM, such as a Printed Circuit Board (PCB) or a ceramic substrate, in an inverted orientation such that the frontside I/O interface of the RF power die faces the die support surface of module substrate. Electrical interconnections between contact pads contained in the die's frontside I/O interface and the corresponding electrical routing features of the module substrate may be formed utilizing contact extensions, such as solder balls or electrically-conductive pillars, to avoid the usage of wire bonds in at least some instances. This may minimize parasitic losses during PAM operation to improve operational efficiency, particular when the RF power die is operated at higher frequencies approaching or exceeding 3 Gigahertz. The inverted mounting of an RF power die (or power dies) within a PAM may also avail the backside of the RF power die for usage in optimized cooling or heat extraction schemes. In this regard, a low thermal resistance, volumetrically robust heat extraction path may be created extending from the backside of the inverted RF power die to a thermal interface, which is exposed along the outer principal surface of the PAM opposite the module substrate. By virtue of such a thermal interface design, relatively large quantities of excess heat generated within the RF power die during PAM operation can be conductively transported to the thermal interface in an efficient manner, with the thermal interface potentially placed in thermal contact with a heatsink (e.g., a metal chassis or fin structure) when the PAM is installed within a larger electronic assembly. A highly effective thermal management solution is thus provided to further optimize RF power die performance.

A given PAM may contain one or more RF power dies; and, in certain embodiments, may contain at least one peaking RF power die and at least one carrier RF power die arranged in a Doherty amplifier architecture. When a given PAM contains multiple RF power dies, at least one (and possibly all) of the RF power dies may possess a flip-chip architecture as described herein; e.g., in the case of a Doherty amplifier PAM, at least the carrier RF power die(s) (and possibly the peaking RF power die(s)) may be imparted with a flip-chip architecture, as described herein, given the propensity for carrier RF power dies to experience greater heat loads given the cumulative duration of time over which the carrier transistor integrated circuit (IC) remains in a conducting state for a given operative period of the die. The advantages of Doherty amplifier topologies notwithstanding, the flip-chip RF power dies can be integrated into various other types of PAMs in addition to Doherty amplifier PAMs, including push-pull-type amplifier modules. Additionally, while the above-described thermal interface is highly beneficial from a thermal performance standpoint, embodiments of the PAMs described herein need not include such a thermal interface in all implementations, particularly when excessive heat concentrations within the flip-chip RF power die or dies contained within a PAM are non-problematic. Finally, while beneficially integrated into a PAM utilizing an interconnection technology other than wire bonding, the possibility that a given RF power die may include one or more terminals electrically interconnected with corresponding routing features of a module substrate by wirebonding is not precluded.

Regardless of the particular PAM or other microelectronic device into which a given RF power die is integrated, the flip-chip RF power die includes a die body having a frontside and an opposing backside, as well as frontside layer system formed over the frontside of the die body. The frontside layer system contains a plurality of patterned metal layers, which are embedded in dielectric layers successively built-up or compiled over the frontside of the die body following doping of the active transistor regions during wafer-level processing. It is emphasized, however, that any suitable number and type of transistors (including bipolar transistors) may be formed in a given RF power die having a flip-chip architecture of the type described herein. Unique transistor layouts, and complementary patterned metal routing schemes (herein, referred to as "patterned wiring structures") formed in the frontside layer systems, enable the formation of a frontside I/O interface containing contacts to all terminals (referred to herein generally as the current supply, current return, and signal input (control) terminals) of the transistor or transistors integrated into given RF power die. For example, when a field effect transistor (FET) is formed in a given RF power die, the frontside I/O interface may be produced to include at least one drain bond pad, at least one source bond pad, and at least one gate bond pad. The drain, source, and gate bond pads are electrically interconnected with corresponding routing or "branched electrode" structures formed in additional regions of the patterned metal layers contained within the frontside layer system. Such branched electrode structures include manifolds from which elongated fingers or runners extend to provide the desired contacts with the active regions of the FET (or other transistor) integrated into the flip-chip RF power die.

Continuing the foregoing example in which a FET IC is formed in a given flip-chip RF power die, the branched drain, gate, and source electrode structures may each include a manifold, such as a bar-shaped patterned metal body, from which a plurality of elongated fingers or runners extends. In embodiments, the gate and drain runners may be positioned in an interleaved or interdigitated relationship, as seen looking downwardly on the frontside layer system along a vertical axis or centerline orthogonal to the frontside of the die body. In embodiments, such an interdigitated finger or runner layout may resemble certain conventional RF power transistor topologies in certain respects. In the case of RF power dies having conventional transistor layouts, however, the ground or current return path (e.g., conductive structures coupled between the source region of a given FET and a ground reference voltage) is typically routed through the die body, in a direction away from the frontside layer system, to an electrically-conductive layer or multi-layer system otherwise formed over the backside of the die body (herein, a "backmetal structure"). Thus, in the context of such a conventional RF power die design, the metallized backside of the RF power die serves as ground (or another reference voltage) contact of the die, which is electrically coupled to the source regions of the FET. As a corollary, the frontside I/O interface of such a conventional, non-inverted RF power die typically only possesses two bond pad types (gate and drain bond pads) for interconnection with corresponding routing features of the PAM substrate. Further, non-inverted RF power dies may be produced utilizing high electrical resistance substrates; that is, semiconductor material-containing substrates having bulk electrical resistances exceeding 520 ohms ($\Omega$) per centimeter (cm) and, perhaps, approaching or exceeding 1 mega-$\Omega$ per cm. When so produced, an RF power die may include a number of through substrate vias (TSVs) to provide electrical connection from the source region(s) of the FET IC to the metal layer(s) formed on the backside of the die body. The usage of such high electrical resistance substrates enables relatively high power densities to be achieved as is often desirable in the context of high power amplifier applications. Such high electrical resistance substrates include high resistance bulk silicon (Si) substrates, silicon-on-insulator (SOI) substrates, diamond-based and glass-based substrates, layered Gallium Nitride (GaN) structures, and layered Gallium Arsenide (GaAs) structures, to list but a few examples.

While facilitating the usage of high resistivity die structures, the inclusion of TSVs within an RF power die is associated with certain limitations. TSV formation often adds considerable cost and duration to manufacturing processes. Additionally, TSV formation may increase the likelihood of die cracking or other structural compromise of RF power dies, which can potentially decrease yield and increase average per-die manufacturing costs. As a further drawback, the overall dimensions of a given RF power die are often enlarged to accommodate the provision of TSVs, which require certain minimum lateral spacings between the TSVs and doped transistor regions. In contrast, the flip-chip RF power dies described herein can be produced to lack TSVs (or, perhaps, with a reduced TSV presence) to overcome most, if not all of the foregoing limitations. Cost savings may be realized by eliminating those process steps associated with TSV formation. Further, through the elimination (or reduction) of TSVs, die size can be reduced to provide further cost savings, while manufacturing yield are improved due to a reduced likelihood of die cracking during IC die fabrication. The end result is a highly compact flip-chip RF power die providing cost efficient fabrication and other benefits, such as an increased structural robustness and enhanced isolation properties (discussed below), relative to RF power dies having conventional, non-flip-chip architectures. Additionally, such flip-chip RF power dies are readily (although non-essentially) incorporated into enhanced PAM designs having thermal interfaces and/or wire bond-free constructions, as previously discussed. Finally, such flip-chip RF power dies may be fabricated to include an electrically-inactive backmetal structure to, for example, enhance thermal conduction via bonding to a metallic slug or other thermal extension contain in a given PAM, as descried below; or, instead, may be produced to lack a backmetal structure to further streamline cost-efficient manufacturing.

Example embodiments of RF power dies having flip-chip architectures, as well as PAMs containing such flip-chip RF power dies, will now be described in conjunction with FIGS. 1-12. For ease of explanation, the following initially describes RF power dies and PAMs having relatively simple constructions; e.g., the example PAMs discussed below in conjunction with FIGS. 2-4 may each contain a single RF power die (or two dies) enclosed in a molded module body. However, as further discussed below in connection with FIG. 12, embodiments of the PAMs can vary in complexity and may contain any practical number of RF power dies and other microelectronic components distributed across a module substrate including, for example, any number of surface mount devices (SMDs), embedded routing structures, or other IC-bearing semiconductor die. Further, alternative embodiments may not include a molded die-encapsulating body or may otherwise differ relative to the below-described PAMs, providing that each PAM contains at least one RF power die having a flip-chip architecture. The flip-chip RF power dies described herein need not be incorporated into PAMs in all instances; and, instead, can be employed in application or usage requiring power or signal amplification, while benefiting from the usage of the below-described RF power dies in some manner.

Example RF Power Dies Having Flip-Chip Architectures and Power Amplifier Modules Containing the Same FIG. 1 is a cross-sectional view of an RF power die 20 having a flip-chip architecture, as illustrated in accordance with an example embodiment of the present disclosure. RF power die 20 includes a die body 22 having a frontside 24 and an opposing backside 26. Frontside 24 and backside 26 of die body 22 are spaced along a centerline or vertical axis of RF power die 20, which extends substantially orthogonal to frontside 24 and corresponds to the Z-axis of coordinate legend 28 appearing in the lower left of FIG. 1. A frontside layer system 30, which contains a number of patterned metal layers, is integrally formed with die body 22 by build-up over frontside 24. Frontside layer system 30 can include any practical number of patterned metal layers greater than one and will commonly contain between three and five patterned metal layers formed at different levels or elevations along a vertical axis (again, defined herein as an axis extending orthogonal to frontside 24 and parallel to the Z-axis of coordinate legend 28). Terms of relative positioning, such as "above" and "beneath," are utilized below to describe the various features formed within frontside layer system 30. Such terms are defined in relation to relative proximity to frontside 24 of die body 22 such that, for example, a first feature or element may be described as located at a level "above" a second feature or element when the second feature is located closer to die body frontside 24 than is the first feature. Similarly, the term "over" is utilized throughout this document to describe the relative positioning between two features or elements sharing a vertically overlapping relationship, as taken along a vertical axis. Thus, as an example, frontside layer system 30 is described as formed over frontside 24 of die body 22 regardless of the particular orientation of RF power die 20 in free space.

As previously indicated, the number of patterned metal layers included in frontside layer system 30 will vary between embodiments. In the illustrated embodiment, and by way of non-limiting example, frontside layer system 30 is schematically depicted as containing five patterned metal layers. By common nomenclature, these patterned metal layers may be referred to as the "M1" through "M5" patterned metal layers, with the descriptor "M1" referring to the initially-formed patterned metal layer, the descriptor "M2" referring to the patterned metal layer formed after the M1 patterned metal layer, the descriptor "M3" referring to the patterned metal layer formed after the M2 patterned metal layer, and so on. Further, in keeping with the foregoing description, the M1 patterned metal layer may be referred to as the "innermost" or "inner" patterned metal layer herein, while the M5 patterned metal layer may be referred to as the "outermost" or "outer" patterned metal layer. The patterned metal layers are surrounded by layers of dielectric material, which collectively form a dielectric body generally identified by reference numeral "34" in FIG. 1. Such dielectric layers 34 may also include at least one outer terminal dielectric layer 36, which serves as a solder mask or as a passivation layer. A frontside I/O interface 38 is further provided along the outer terminal surface of frontside layer system 30 (commonly referred to as the "frontside" of RF power die 20) and includes a number of bond pads 40, which provide electrical connection to the different terminals of the transistor IC integrated into RF power die 20, as further discussed below.

The innermost (M1) metal layer is patterned to define various metal features, which provide contact to active regions 42, 44, 46 included in at least one transistor formed in RF power die 20. When a FET IC is integrated into RF power die 20, the active transistor regions will generally include doped source regions 42 and doped drain regions 46 formed in die body 22 at locations adjacent frontside 24 of die body 22; or, perhaps, buried beneath frontside 24 by some amount depending upon the nature of the implants used and the desired transistor topology. The term "active region," as appearing herein, also encompasses regions 44 of semiconductor material located between adjacent source and drain regions 42, 46 and in which the transistor channel forms when a given FET begins conducting. In alternative implementations, the active transistor regions may include the emitter and collector regions when one or more bipolar transistors are integrated into RF power die 20. Generally, it may be stated that a transistor integrated circuit 48 or "transistor IC 48" is formed in RF power die 20. The term "transistor IC" is utilized to indicated that more than one transistor may be integrated into RF power die 20 and/or additional circuit elements (e.g., impedance matching, harmonic termination, or biasing circuitry) may be formed in RF power die 20 in embodiments of the present disclosure. In the following description, transistor ICs containing a single FET (e.g., FET IC 48) are discussed for purposes of explanation. In further embodiments, however, other types of transistors (e.g., bipolar transistors) may be integrated into RF power die 20 and/or more complex transistor ICs may be provided, such as multi-stage transistor ICs containing multiple transistors formed on a single RF power die. Further, embodiments of the present disclosure can be utilized with various different die technologies, transistor types, and transistor topologies. For example, when the transistor or transistors carried by RF power die 20 assume the form of a FET, the FET can be implemented utilizing any of the following die technologies: a silicon-based FET (e.g., a laterally-diffused metal oxide semiconductor FET or LDMOS FET) or a III-V FET (e.g., a GaN FET, a GaAs FET, a gallium phosphide (GaP) FET, an indium phosphide (InP) FET, or an indium antimonide (InSb) FET, or another type of III-V transistor).

Electrically-conductive routing or wiring features are formed in and between the patterned metal layers of frontside layer system 30 to provide electrical interconnections from externally-exposed bond pads 40 to corresponding patterned features included in the M1 patterned metal layer and active regions 42, 44, 46 of FET IC 48. These patterned metal features are shown in a highly simplified form in the schematic of FIG. 1 and can vary in geometric complexity as required to best suit the layout of the transistor (or transistors) included in FET IC 48. When frontside layer system 30 contains three or more patterned metal layers, relatively complex wiring schemes or patterned metal layer architectures can be employed. Examples of such wiring schemes are described more fully below in connection with FIGS. 5-9 and will therefore not be discussed in depth at this juncture in the description. However, at this juncture in the description, it may be generally noted that each type of bond pad included in bond pads 40 (e.g., signal input, current supply, and current return bond pads) may be electrically coupled to a corresponding active transistor region of FET IC 48 through a branched electrode structure; that is, an electrically-conductive structure including at least one conductive manifold from which a plurality of elongated conductive fingers or runners extends. Specifically, and again referring to the example of a FET, a first type of bond pad included in bond pads 40 may be electrically coupled to corresponding metal features included in or below the M1 patterned metal layer (e.g., the "gate terminals" overlying the channel-formation regions of transistor IC 48) through a first branched electrode structure. A second type of bond pad included in bond pads 40 (e.g., one or more source bond pads) may be electrically coupled to metal features included in the M1 patterned metal layer (e.g., the "source terminals" or the "source metal" providing contact to the doped source regions of FET IC 48) through a second branched electrode. Finally, a third type of bond pad included in bond pads 40 (e.g., one or more drain bond pads) may be electrically coupled to corresponding metal features included in the M1 patterned metal layer (e.g., the "drain terminals" providing ohmic contact to doped drain regions of the FET) through a third branched electrode.

In the above-described manner, a frontside I/O interface 38 is formed in an outer region of frontside layer system 30 to enable electrical connection to FET IC 48 when RF power die 20 is integrated into a larger device or module, such as a PAM of the type described below in connection with FIGS. 2-4. Additionally, in certain cases, additional non-illustrated bond pads may be included in frontside I/O interface 38 to support other electrical connections associated with operation of FET IC 48, such as bond pads providing electrical connections providing gate or drain biasing of one or more FETs, as further discussed below in conjunction with FIGS. 5 and 6. Several benefits are achieved by virtue of such a transistor topology and integrated wiring scheme, which jointly provide exclusive connection to all transistor terminals through frontside I/O interface 38 in embodiments. Unique frontside wiring structures or topologies, combined with unique complementary transistor layouts, enable the provision of such a frontside I/O interface including at least one signal input or control contacts (e.g., one or more gate bond pads in the case of a FET), at least one current supply contact (e.g., either drain or source bond pad(s) in the case of FET, depending on whether the FET is an N-channel or P-channel device), and at least one current return contact (e.g., again, either drain or source bond pad(s) in the case of FET, depending on whether the FET is an N-channel or P-channel device). Examples such unique transistor topologies and frontside wiring topologies are discussed below in connection with FIGS. 5-11. First, however, RF power die 20 is described in greater detail to provide a non-limiting context in which embodiments of the present disclosure may be better understood.

With continued reference to FIG. 1, a backside metal layer or, perhaps, a multi-layer system (herein, "backmetal structure 32") may be formed over or on backside 26 of die body 22 in at least some realizations of RF power die 20. When present, backmetal structure 32 may be composed of one or more deposited metal-containing layers, which are conveniently electroplated or otherwise formed over backside 26 during wafer-level processing. The provision of backmetal structure 32 may enhance (e.g., metallurgical) bonding and thermal transfer with one or more thermally-conductive structures when RF power die 20 is integrated into a PAM. As indicated in FIG. 1 by arrow 52, a highly efficient thermal conduction or "heat extraction" path may be created from locations within FET IC 48 prone to excess heat generation, such as the locations adjacent the FET IC channel-formation region(s), to back metal structure 32. While arrow 52 is offset from FET IC 48 for visual clarity, the heat extraction path represented by arrow 52 extends from a location adjacent FET IC 48 in a direction opposite frontside I/O interface 38 to backside 26 of die body 22 and, when present, through backmetal structure 32. The thermal performance of RF power die 20 may be enhanced through the provision of such a low thermal resistance heat extraction path, particularly when RF power die 20 has relatively high power density and highly elevated heat concentrations may otherwise occur within RF power die 20 absent the provision of such a heat conduction path. In alternative embodiments, such low thermal resistance thermal conduction path can also be provided through die body 22, while backmetal structure 32 is omitted from RF power die 20. When provided, however, backmetal structure 32 may enhance the effectiveness of heat extraction path due to the relatively high thermal conductivity of the (e.g., metallic) material or materials from which structure 32 is formed. Additionally, when provided, backmetal structure 32 may facilitate the formation of low thermal resistance metallurgical bonds between backmetal structure 32 and one or more additional thermally-conductive structures (e.g., a metal slug or other thermal extension) further embedded in embodiments of the host PAM, as discussed below in connection with FIGS. 2-4.

In certain embodiments of RF power die 20, backmetal structure 32 may be electrically-active and, therefore, utilized for power routing or signal transmission purposes. In this regard, alternative embodiments of RF power die 20 may contain one or more TSVs, which are formed in die body 22 to electrically connect an electrically-active doped region of FET IC 48 (e.g., the source region of FET IC 48) to backmetal structure 32. In this case, backmetal structure 32 may serve as a terminal or contact of RF power die 20 for grounding FET IC 48 when die 20 is installed within a larger system or circuit In such alternative embodiments, die body 22 may be wholly or partly composed of a high electrical resistance semiconductor material (e.g., a high electrical resistance Si) or may possess a multi-layer (e.g., GaN or GaAs) structure possessing a high electrical resistance through its thickness. In still other embodiments of RF power die 20, die body 22 can potentially be composed of a low electrical resistance material, such as a singulated piece of a low electrical resistance bulk Si wafer, such that the doped (e.g., source) region(s) of FET IC 48 are inherently electrically coupled to backmetal structure 32 through die body 22 without the presence of TSVs. These possibilities notwithstanding, several benefits are achieved by selecting die body 22 to lack (be "free of" or "devoid of") TSVs, while having a high electrical resistivity through its thickness; that is, taken along a vertical axis extending parallel to the Z-axis of coordinate legend 28. In such embodiments in which die body 22 possesses a high electrical resistivity, TSV-free structure, backmetal structure 32 (when present) may be electrically inactive and thus not serve as an electrically-conductive contact of RF power die 20.

Die body 22 of flip-chip RF power die 20 may be wholly composed of a single semiconductor material when RF power die 20 is produced utilizing a singulated piece of a bulk semiconductor wafer, such as a bulk Si wafer. For example, in this case, die body 22 may be composed of a high resistivity Si material having an electrical resistivity exceeding about 520Ω per cm and, perhaps, approaching or exceed 1 mega-Ω per cm. In other instances, RF power die 20 may be fabricated utilizing a layered die technology of a type enabling relatively high transistor power densities. An example of such a power dense die technology is a layered GaN structure in which one or more layers of a GaN material (that is, a semiconductor material containing GaN as its primary constituent, by weight) are formed over one or more substrate layers of another material, such as silicon carbide (SiC). Other examples of layered die technologies suitable for producing die body 22 of RF power die 20 include GaAs structures, which likewise support the formation of transistor ICs (e.g., FET IC 48) having relatively high power densities. As is the case when die body 22 is composed of a high resistivity Si (or other bulk semiconductor) material, such layered die technologies also typically possess relatively high electrical resistances exceeding 520Ω per cm taken through the thickness of the layered die structure; that is, in the case of die body 22, along the centerline or a vertical axis parallel to the Z-axis of coordinate legend 28.

In conventional RF power die designs fabricated utilizing high electrical resistance die structures and providing an electrical grounding (current return) path through the backmetal structure (e.g., the backmetal structure electrically connected to the source terminal in the case of a FET), TSVs are typically utilized to provide electrical connection between the corresponding doped (e.g., source) regions of the transistor and the backmetal structure. As previously discussed, TSV formation tends to add complexity and cost to the die fabrication process; and, some instances, may decrease manufacturing yield due to an increased likelihood of crack formation or other structural compromise in the case of certain (e.g., thinner) die structures, depending upon process parameters (e.g., thermal exposures) and other factors. By leveraging unique transistor layouts and integrated wiring strategies within frontside layer system 30, as described in greater detail below, flip-chip RF power die 20 can be fabricated to have a TSV-free construction (or, perhaps, to contain a reduced number of TSV) to improve manufacturing efficiency, lower manufacturing cost, and boost yield, while providing other performance benefits discussed below. Additionally, TSV removal enables a reduction in the overall size of RF power die 20 to further lower manufacturing costs in producing RF power die 20, along with a number of similar or identical RF power dies, during wafer-level processing.

RF power die 20 is well-suited for installation within a PAM in an inverted orientation; that is, such that frontside I/O interface 38 faces toward the lower principal surface or "bottomside" of the PAM and the die support surface of the PAM substrate to which at least one RF power die is mounted, potentially along with any number of additional microelectronic components. Such a PAM design or construction provides several benefits, including enabling highly efficient thermal interface schemes, as mentioned above and discussed in more detail below. Additionally or alternatively, RF power die 20 can be mounted to the PAM substrate in an inverted orientation such that frontside I/O interface 38 may be physically and electrically interconnected with corresponding contact pads or routing features at the die support surface of the PAM substrate without the usage of wire bonds (or, perhaps, with a decreased reliance on wire bonding). Specifically, bond pads 40 included in frontside I/O interface 38 may be electrically and mechanically interconnected with corresponding routing features of the PAM substrate utilizing solder balls, electrically-conductive pillars, or other such contact extensions. Such an interconnection interface may provide an increased structural durability; and, in certain cases, may reduce parasitic losses otherwise occurring during high frequency operation of the RF power die (or dies) contained in the PAM due to the presence of lengthy wire bonds. Additional description in this regard is provided below in connection with FIGS. 2-4. While described below as integrated into a particular type of PAM, it is emphasized that embodiments of RF power die 20 can be integrated into various different types of modules (including microelectronic packages) regardless of whether RF power die 20 includes or lacks TSVs, independent of the interconnection type (whether or not wire bonding is employed), and whether or not RF power die 20 is fabricated utilizing a high electrical resistance die technology.

Turning now to FIG. 2, a simplified cross-sectional view of a PAM 70 containing flip-chip RF power die 20 and an associated thermal interface 72 is illustrated in accordance with an example embodiment of the present disclosure. In addition to thermal interface 72 and RF power die 20, PAM 70 contains a module substrate 74, a molded module body 76, and at least one thermal extension 78. RF power die 20 is mounted to an upper principal surface or "die support surface 80" of module substrate 74. Module substrate 74 may assume the form of a PCB, a ceramic substrate, a coreless substrate, a flat no-leads package body (e.g., a dual or quad flat no-leads package, or DFN/QFN), or another routed structure suitable for supporting RF power die 20 and providing electrical interconnection therewith. As indicated above, flip-chip RF power die 20 is mounted to module substrate 74 in an inverted orientation such that the outer principal surface 82 of frontside layer system 30 of RF power die 20 faces die support surface 80. Molded module body 76 encapsulates RF power die 20, contacts die support surface 80 of module substrate 74, and peripherally surrounds thermal extension 78. An upper principal surface 84 of thermal extension 78 is substantially coplanar or flush with an outer principal surface 86 of molded module body 76. Jointly, upper principal surface 84 of thermal extension 78 and an upper principal surface 86 of molded module body 76 define an outer principal surface 84, 86 of PAM 70, referred to herein as "top surface 84, 86." In other embodiments, and depending upon the manner in which PAM 70 is fabricated, thermal extension 78 may be recessed relative to or may project from PAM top surface 84, 86, providing that upper principal surface 84 of thermal extension 78 is externally exposed along PAM top surface 84, 86 to provide the option of subsequent thermal coupling to an assembly-level heatsink when PAM 70 is installed within a larger electronic system or assembly, as described below in connection with FIG. 3.

As previously described in connection with FIG. 1, RF power die 20 includes a frontside I/O interface 38, which contains a number of I/O bond pads 40 facilitating electrical interconnection to the various terminals of FET IC 48 integrated into RF power die 20. In particular, a first bond pad (or a first set of bond pads) included in I/O bond pads 40 may serve as a signal input or control terminal of RF power die 20, a second bond pad (or a second set of bond pads) may serve as a current supply terminal of RF power die 20, and a third bond pad (or a third set of bond pads) may serve as a current return (e.g., ground or reference voltage) terminal of die 20. A corresponding I/O interface is provided on a die support surface 80 of module substrate 74, with various electrically-conductive interconnect features 88 (vias and substrate interconnect lines) formed in or on module substrate 74. Accordingly, electrically-conductive interconnect features 88 may include first, second, and third interconnects lines 92, 94, 96 formed in and/or on a body of dielectric material 98 (e.g., a ceramic or laminated layers of a PCB) electrically coupled to and aligned with the appropriate die bond pads 40. Depending on the manner in which PAM 70 is fabricated, die bond pads 40 may be electrically coupled to the corresponding bond pads and interconnect lines 92, 94, 96 of module substrate 74 through a number of lower contact extensions 100, such as an array of solder balls, bumps, electrically-conductive pillars, or the like. In further implementations, various other types of interconnections or mounting schemes may be utilized to provide the desired electrical connections between the frontside I/O interface of RF power die 20 and module substrate 74. For example, in certain embodiments, RF power die 20 may be directly mounted to module substrate 74 without the provision of contact extensions, subject to the manufacturing process utilized to produce PAM 70.

A backside surface 102 of RF power die 20 (e.g., an outer terminal surface of backmetal structure 32, when present) is bonded to an interior or lower principal surface 104 of thermal extension 78 by a thermally-conductive bond layer 106. Thermally-conductive bond layer 106 may be composed of any material suitable for mechanically joining RF power die 20 to thermal extension 78, while further possessing a relatively high thermal conductivity; e.g., the thermal conductivity of bond layer 106 may exceed 30 Watts per meter Kelvin (W/mk) and, perhaps, may exceed 100 W/mk in embodiments. Suitable materials include metal-filled (e.g., copper (Cu), gold (Au), and silver (Ag) filled) epoxies, solder materials (e.g., deposited solder pastes and solder finishes applied to thermal extension 78), and thermally-conductive die attach materials including metal-metal (e.g., tin-Cu) transition liquid phase systems. In certain embodiments, thermally-conductive bond layer 106 may be composed of a sintered metallic material; that is, a material formed from sintered metallic particles and predominately composed of one or more metallic constituents, by weight. When composed of a sintered material, thermally-conductive bond layer 106 may be predominately composed of copper (Cu), silver (Ag), gold (Au), or a mixture thereof, by weight. Also, in such instances, thermally-conductive bond layer 106 may or may not contain organic materials, such an epoxy added for strengthening purposes. If desired, backside surface 102 of RF power die 20 may be metallized (e.g., via the provision of backmetal structure 32 shown in FIG. 1) to form a robust metallurgical bond with thermally-conductive bond layer 106 when composed of a sintered metal material For example, in embodiments, a backmetal layer (e.g., a relatively thick layer of Cu) may be plated or otherwise deposited onto backside surface 102 of RF power die 20. Similarly, lower surface 104 of thermal extension 78 may likewise be plated, roughened, or otherwise treated to promote bonding with thermally-conductive bond layer 106 in embodiments.

Thermal extension 78 can be produced by depositing an electrically-conductive material onto backside surface 102 of RF power die 20, such as by electroplating one or more layers of a metal-containing material onto die backside surface 102. Alternatively, and as indicated in FIG. 1, thermal extension 78 may be provided as a prefabricated piece or part, which is positioned over and bonded to RF power die 20 via a thermally-conductive bond layer 106. In embodiments, thermal extension 78 may assume the form of a metallic block predominately composed of a metallic material, such as Cu, Au, Ag, aluminum (Al), or nickel (Ni), and alloys thereof, by weight. In other embodiments, thermal extension 78 may be fabricated from a composite material or a non-metallic material having relatively high thermal conductivities. Such materials include, but are not limited to, diamond polycarbonate materials, diamond-metal composites (e.g., diamond Au, diamond Ag, and diamond Cu), Cu graphite, pyrolytic graphite, and materials containing allotropes of carbon, such as graphene and carbon nanotube-filled materials. Regardless of its particular composition, thermal extension 78 is ideally selected to have a relatively high thermal conductivity, particularly in a vertical direction (parallel to the Z-axis of coordinate legend 28) along which heat is conducted upwardly away from RF power die 20 and module substrate 74 during operation of PAM 70. Accordingly, in embodiments, thermal extension 78 may have a thermal conductivity exceeding 100 W/mk and, perhaps, a thermal conductivity exceeding 200 W/mk, as taken along the section of a primary heat extraction path extending through thermal extension 78 in a direction away from module substrate 74.

Thermal extension 78 may be imparted with a thickness greater than that of RF power die 20 in embodiments, as measured along a vertical or centerline axis (corresponding to the Z-axis of coordinate legend 28) and as indicated in FIG. 2 (not drawn to scale). In other embodiments, thermal extension 78 may have a thickness less than or substantially equivalent to RF power die 20. The planform dimensions (length and width) of thermal extension 78 may be substantially equal to or greater than the planform dimensions (length and width) of RF power die 20, as measured along the X- and Y-axes of coordinate legend 28, respectively. Two quantities are considered "substantially equivalent," as appearing in the context of this document, when the quantities differ by a disparity of less than 10%. Dimensioning thermal extension 78 in such a manner enlarges the area of lower surface 104 in contact with the backside surface 102 of RF power die 20 to promote heat flow from RF power die 20, through bond layer 106, and to thermal extension 78. As further indicated in FIG. 2, thermal extension 78 may be generally centered over RF power die 20 in embodiments, as a taken along a vertical axis or centerline extending through PAM 70 (again, parallel to the Z-axis of coordinate legend 28) and intersecting thermal extension 78 and die 20. In other embodiments, thermal extension 78 may have a different positioning relative to RF power die 20, providing that thermal extension 78 is thermally coupled to backside surface 102 of RF power die 20. In many instances, thermal extension 78 will be positioned directly above RF power die 20; e.g., thermal extension 78 may be positioned to overlap at least a majority, if not the entirety of RF power die 20 as taken along a vertical or centerline axis extending through thermal extension 78 and die 20 and orthogonal to backside surface 102 of RF power die 20. In further embodiments, multiple thermal extensions may be placed in thermal contact with RF power die 20; or a given thermal extension can be implemented as a plurality of thermal vias (e.g., thermally-conductive pillars or rods) extending from the backside of RF power die 20 toward, and possibly to, top surface 86 of PAM 70.

By virtue of the above-described structural arrangement, a high thermal conductivity, dimensionally-robust heat extraction path is created extending from backside surface 102 of inverted RF power die 20, through thermally-conductive bond layer 106, through thermal extension 78, and to thermal interface 72 of PAM 70. Further, a straight line following the primary heat dissipation path can be drawn from backside surface 102 of RF power die 20 to thermal interface 72, with no portion of the straight line extending through a region of material having a thermal conductivity less than 30 W/mk or, perhaps, less than 100 W/mk in embodiments. Such a primary heat extraction path is represented in FIG. 1 by arrow 52 and provides an efficient, direct (non-tortuous), volumetrically robust thermal conduction path for transferring excess heat from RF power die 20 to an assembly-level heatsink external to PAM 70, when such an assembly-level heatsink present within the larger electronic assembly in which PAM 70 is ultimately installed. This may be further appreciated by referring to FIG. 3, which illustrates in simplified cross-section a portion of an electronic assembly 108 in which PAM 70 may be installed in an embodiment; and also referring to FIG. 4, which illustrates a portion of electronic assembly 108 in an exploded isometric view. As can be seen in these drawing figures, electronic assembly 108 includes an assembly-level substrate 110, such as a motherboard, to which PAM 70 is mounted. The I/O interface of PAM 70 may be electrically coupled to corresponding, aligned, interconnect features (e.g., bond pads and traces) on the upper surface of assembly-level substrate 110 utilizing any suitable interconnection technique, such as an array of electrically-conductive (e.g., Cu) posts or solder balls 112.

As previously indicated, an array of electrically-conductive posts, pillars, or solder balls 112 may be deposited; and, when composed of solder or possessing a solder finish, reflowed to electrically interconnect PAM 70 with a corresponding interface formed on a support surface 118 of assembly-level substrate 110. FIG. 4 depicts a simplified example of such electrically-conductive routing features, here in the form of metal (e.g., Cu) traces 120 and bond pads 122. PAM 70 seats on bond pads 122 to provide a mechanical bond and complete the desired electrical connections between the terminals of PAM 70 and the routing features of assembly-level substrate 110. In other embodiments, a patterned solder layer, flat no-leads package contacts, a land grid array (LGA), a pin grid array (PGA), or a different ball grid array (BGA) may be utilized to mount PAM 70 to and electrically interconnect PAM 70 with assembly-level substrate 110. All such mounting interfaces enable PAM 70 to be mechanically and electrically interconnected with the corresponding routing features of assembly-level substrate 110 without the need for wire bonding, providing the benefits mentioned above. Further, as only a limited portion of assembly-level substrate 110 is shown in FIGS. 3 and 4 for clarity, various other components may be distributed across the non-illustrated portions of assembly-level substrate 110, potentially including other PAMs similar to PAM 70, to form the desired circuit structure.

Figure 4:
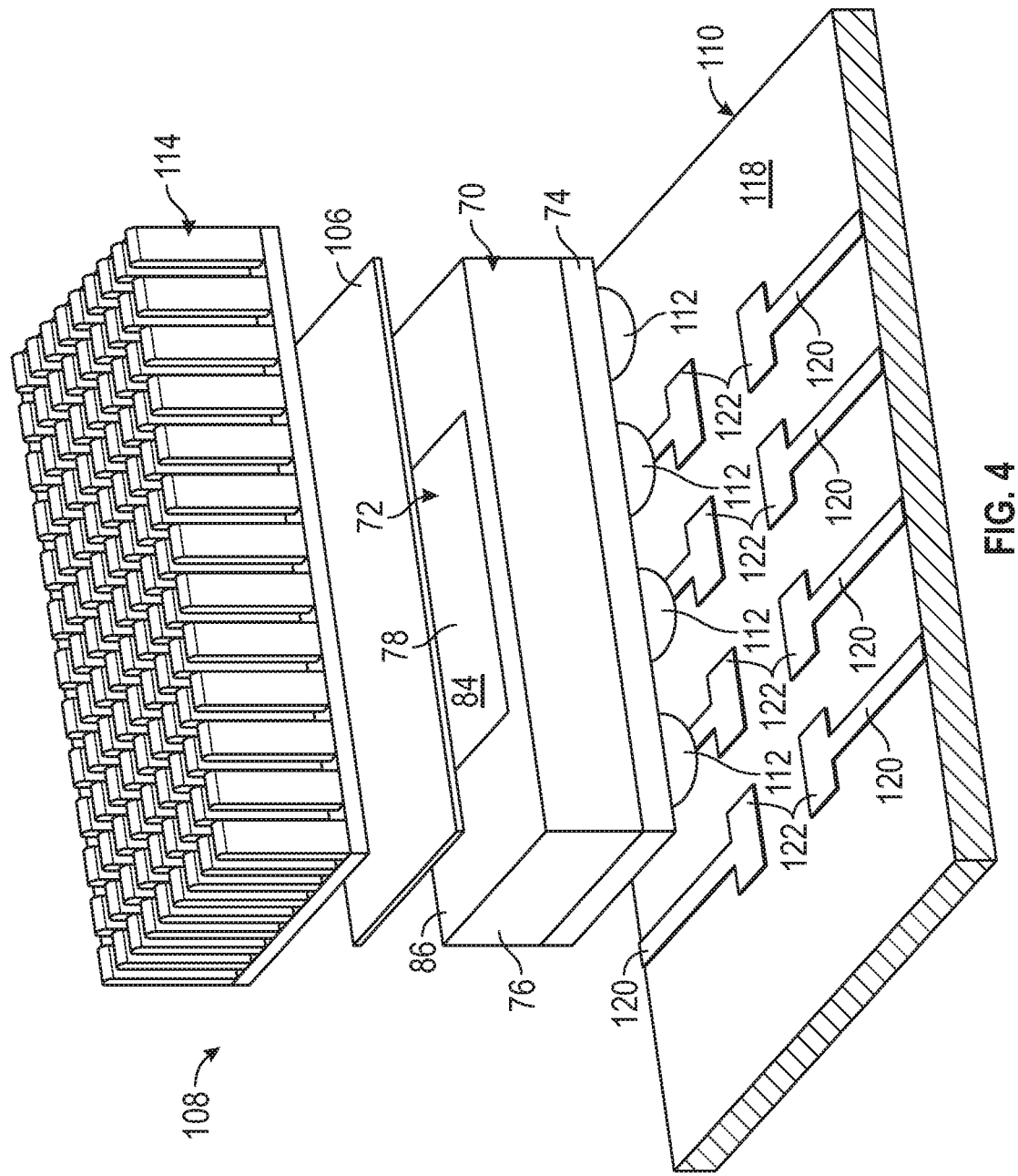

As shown in FIGS. 3 and 4, an assembly-level heatsink 114 may be mounted directly to top surface 84, 86 of PAM 70 and bonded to thermal interface 72 utilizing, for example, a thermally-conductive bond layer 116, along with mechanical structures such as clamps or screws that secure heatsink 114 in a fixed position with respect to the assembly-level substrate 110. Thermally-conductive bond layer 116 can be composed of any thermally-conductive bonding material, including thermal grease and/or those materials discussed above in connection with thermally-conductive bond layer 106; the term "thermally-conductive," as appearing here, defined as having a thermal conductivity exceeding 10 W/mk. In other embodiments, assembly-level heatsink 114 may be thermally coupled to thermal interface 72 in a less direct manner. For example, assembly-level heatsink 114 may be spatially separated from PAM 70, while a thermal conduit (e.g., a metallic body or an elongated heat pipe) is thermally coupled between heatsink 114 and thermal interface 72. Regardless of its particular location relative to PAM 70, assembly-level heatsink 114 can be any thermally-conductive structure or device suitable for absorbing excess heat extracted from PAM 70 through thermal interface 72. For example, in embodiments, assembly-level heatsink 114 may be a metal chassis, a fin structure (e.g., a pin-fin array), or another thermally-conductive body external to PAM 70. Assembly-level heatsink 114 will often, but need not necessarily have a volume exceeding that of thermal extension 78. Assembly-level heatsink 114 may be convectively cooled by releasing heat to the ambient environment; and, in certain embodiments, a fan may direct airflow against assembly-level heatsink 114 to promote convective heat transfer to the impinging airflow. It is also possible for assembly-level heatsink 114 to be actively cooled utilizing a liquid coolant in embodiments. Generally, then, assembly-level heatsink 114 can assume different forms and configurations depending upon the characteristics of electronic assembly 108. It is also possible for PAM 70 to be installed within a larger electronic system or assembly, while thermal interface 72 is left exposed (and thus not directly thermally coupled to a heatsink) if such an arrangement provides sufficient heat dissipation from PAM 70 in certain applications. In still other instances, PAM 70 may lack any such thermal interface, providing PAM 70 contains at least one RF power die (e.g., RF power die 20) having a flip-chip architecture of the type described herein.

An example PAM into which embodiments of the flip-chip RF power die may be incorporated has been described in connection with FIGS. 2-4. Next, example transistor layouts and integrated wiring topologies (as formed in frontside layer system 30 of example RF power die 20), which support the formation of frontside I/O interface 38, will be discussed in greater detail in connection with FIGS. 5-9. Referring initially FIGS. 5 and 6, a FET topology, structure, or layout 124 is schematically shown in an example embodiment of the present disclosure. In FIGS. 5 and 6, and in the subsequent drawing figures, the dielectric material or materials (e.g., dielectric layers 34 shown in FIG. 1) contained in frontside layer system 30 are not shown and, thus, hidden from view. The dielectric layers of frontside layer system 30 are hidden to better reveal the internal electrically-conductive wiring features, defined by patterning of the metal layers included in frontside layer system 30. Example FET layout 124 includes source, gate, and drain bond pads contained in the frontside I/O interface 38 of RF power die 20. These bond pads are identified by reference numerals 54, 56, and 58 in FIGS. 6-9 to distinguish between different bond pad types; while noting, for correlation between the drawing figures, that the below-described bond pads 54, 56, 58 generally correspond to bond pads 40 described above in connection with FIGS. 1-4. Specifically, as identified in FIGS. 5-9, FET layout 124 includes an elongated gate bond pad 56, an elongated drain bond pad 58, and two source bond pads 54 (individually referred to as source bond pad "54-1" and "54-2"). Various other circuit elements may be also formed in frontside layer system 30 or otherwise included in FET IC 48 including, for example, bias circuitry, impedance matching circuitry, electrostatic discharge circuitry, and odd-mode resistors. For example, FET layout 124 may further include gate bias contacts 126, which are electrically connected to longitudinally-opposed edges of gate bond pad 56 via interconnect lines 128. Drain bias contacts (not shown) also may be incorporated into FET layout 124 in addition to or in lieu of gate bias contacts 126 in further implementations.

FET topology layout 124 is elongated along a first or longitudinal axis, which corresponds to the X-axis of coordinate legend 28. Gate bond pad 56 and drain bond pad 58 are likewise elongated along the X-axis of coordinate legend 28, extend substantially parallel to one another, and are spaced along a second, lateral axis perpendicular to the longitudinal axis (corresponding to the Y-axis of coordinate legend 28). A power transistor, including an interdigitated transistor array 130, is provided between gate bond pad 56 and drain bond pad 58, as taken along the lateral axis of RF power die 20 (again, corresponding to the Y-axis of coordinate legend 28). Stated differently, gate and drain bond pads 56, 58 are located on opposing sides of interdigitated transistor array 130 along the lateral axis (Y-axis) and extend substantially parallel thereto along the longitudinal axis (X-axis) of FET layout 124. Comparatively, in the illustrated example, source bond pads 54 are spaced along the longitudinal axis (X-axis) of FET layout 124 and positioned on opposing sides of interdigitated transistor array 130 and gate bond pad. Source bond pad 54-1 is therefore located on a first side of gate bond pad 56 and interdigitated transistor array 130, while source bond pad 54-2 is located adjacent the second, opposing of gate bond pad 56 and interdigitated transistor array 130. To accommodate this positioning of source bond pads 54, while enabling the length of drain bond pad 58 to be maximized along the longitudinal axis (X-axis), interdigitated transistor array 130 and gate bond pad 56 are imparted with longitudinal lengths (measured along the X-axis) less than the length of drain bond pad 58; e.g., as shown in FIG. 6, interdigitated transistor array 130 and gate bond pad 56 may have substantially equivalent lengths along the X-axis, which may range from about 60% to about 90% the length of drain bond pad 58. Additionally, in the instant example, the surface area of drain bond pad 58 exceeds the surface area gate bond pad 56, which, in turn, exceeds the cumulative surface area of source pads 40.

Interdigitated transistor array 130 includes a plurality of drain fingers or runners 132 (identified in FIGS. 7-10), which extend or project from a longitudinally-elongated drain manifold 134. Interdigitated transistor array 130 also includes a plurality of source fingers or runners 136 (again, identified in FIGS. 7-10), which extend from a longitudinally-elongated source manifold 138. Drain runners 132 and source runners 136 are "interdigitated" or "interleaved" in the sense that intermediate and terminal portions of runners 132, 136 extend between one another to form a comb-like arrangement, as seen looking downwardly onto transistor array 130 along an axis orthogonal to an outer principal surface of RF power die 20 (parallel to the Z-axis of coordinate legend 28). Similarly, FET layout 124 also includes a plurality of gate fingers or runners 140 (identified in FIGS. 7-10), which extend from a longitudinally-elongated gate manifold 142. As do drain runners 132 and source runners 136, gate runners 140 further extend into interdigitated transistor array 130, as seen looking downwardly onto interdigitated transistor array 130 along an axis orthogonal to the outer principal surface of frontside layer system 30. However, in contrast to drain runners 132 and source runners 136, gate runners 140 are at least partially formed in frontside layer system 30 at a location beneath drain runners 132 and source runners 136, as shown most clearly in FIGS. 8 and 9 and discussed below. The combination of drain runners 132 and drain manifold 134 is considered to form a branched drain electrode herein, the combination of source runners 136 and source manifold 138 is considered to form a branched source electrode, and the combination of gate runners 140 and gate manifold 142 is considered to form a branched gate electrode.

Figure 7:
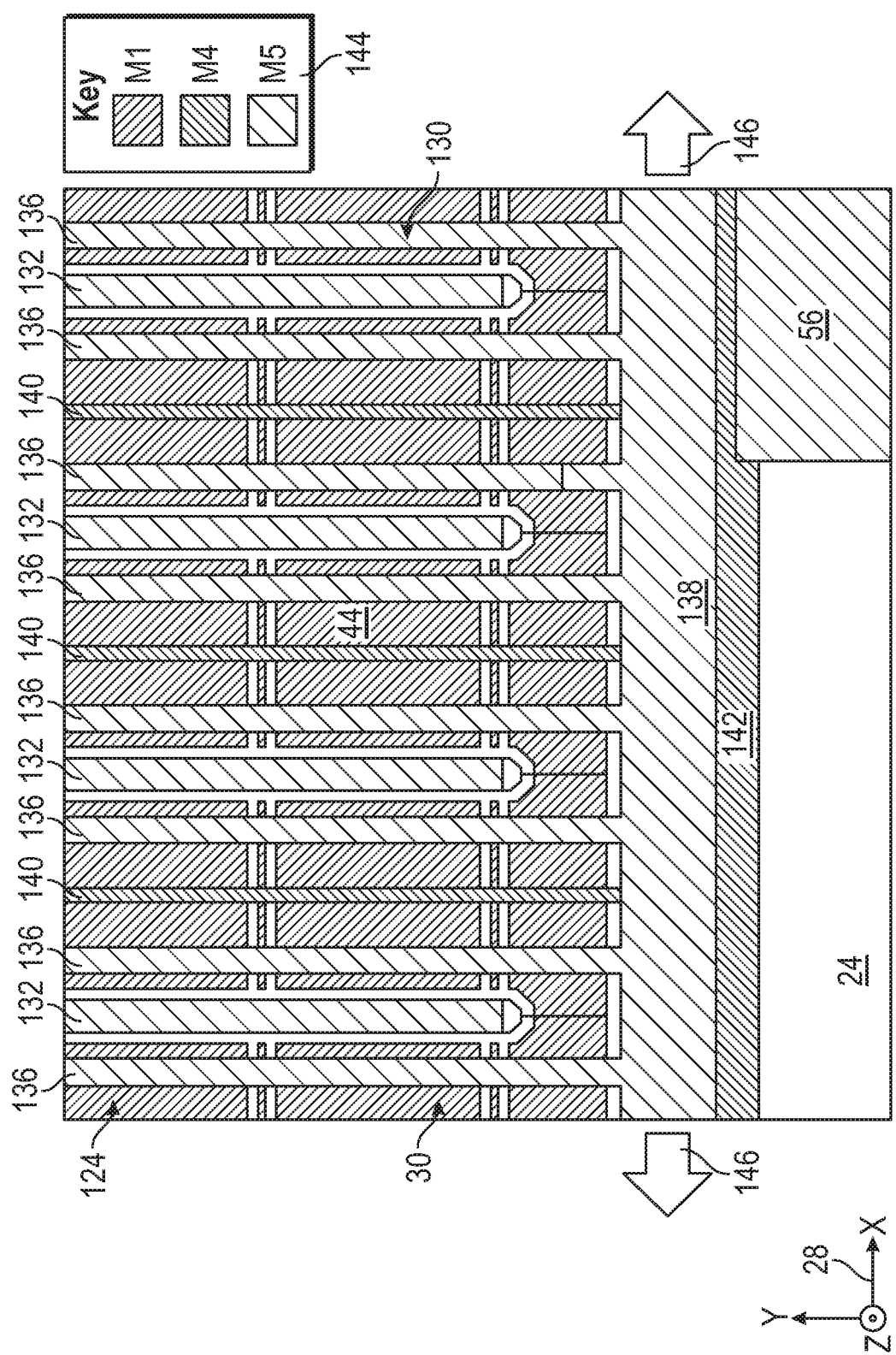
FIGS. 7, 8, and 9 are planform, first cross-sectional, and second cross-sectional views, respectively, of a plurality of patterned metal layers contained in the frontside layer system (partially shown) of the example transistor layout shown in FIGS. 5 and 6.

Advancing to FIG. 7, a limited region of FET layout 124 is shown in greater detail from a top-down or planform viewpoint. As indicated by key 144, features formed by patterning of the various metal layers included in frontside layer system 30 are identified by different cross-hatch patterns. Vias or metal plugs are further formed between the patterned metal layers to provide various vertically-extending electrical interconnect between the different features formed in the M1, M4, M5 patterned metal layers, but are hidden from in FIG. 7. Such vias or metal plugs are further illustrated in FIGS. 8 and 9, which illustrate regions of FET layout 124 in cross-sectional perspective views to more clearly illustrate the three dimensional wiring structure of FET layout 124. Again, dielectric layers 34 (FIG. 1) contained in frontside layer system 30 are hidden from view in FIGS. 7-9 to better reveal the interior structure of FET layout 124. The region of FET layout 124 shown in FIG. 7 encompasses a portion of source manifold 138 from which source runners 136 extend. As indicated by arrows 146, opposing ends of source manifold 138 connect to source bond pads 54-1 and 54-2 through interconnect lines 148 (FIG. 6), which extend from opposing sides of source manifold 138 and to longitudinally-opposed source bond pads 54. In the illustrated example, and as indicated by key 144, source manifold 138, source bond pads 54, and interconnect lines 148 are defined as patterned features of the outermost (M5) patterned metal layer. Similarly, drain bond pad 58 and drain manifold 134 may likewise be formed as patterned features of the outermost (M5) patterned metal layer, with drain manifold 134 extending from the inboard longitudinal edge of drain bond pad 58 toward the interdigitated runner array 130 as shown most clearly in FIG. 6. Gate bond pad 56 is likewise formed in the outermost (M5) patterned metal layer of frontside layer system 30 in the illustrated example. In further embodiments, the foregoing metal features or structures may be formed in different patterned metal layers of frontside layer system 30; e.g., such that manifolds 134, 138 are formed in the same or different intermediate or lower patterned metal layers (e.g., the M2 through M4 patterned metal layers), while bond pads 54, 56, 58 are formed in the outermost (e.g., M5) patterned metal layer.

With continued reference to FIGS. 6-10, gate manifold 142 and gate runners 140 are formed in one or more lower patterned metal layers; here, the patterned M4 layer. Gate bond pad 56 is electrically interconnected to gate manifold 142 through vertical connections (e.g., vias or metal plugs) formed between the appropriate patterned metal layers; here, through one or more vias formed in between the M4 and M5 patterned metal layers and commonly referred to as "V4" metal vias. By virtue of this structural arrangement, and specifically due to formation of gate manifold 142 and gate runners 140 within one or more lower patterned metal layers located closer to frontside 24 of die body 22 relative to source manifold 138, routing of gate runners 140 beneath source manifold 138 is facilitated. In this regard, gate runners 140 may extend from gate manifold 142 (a portion of which may also extend beneath source manifold 138) and pass beneath source manifold 138 as gate runners 140 extend to positions laterally-adjacent drain runners 132 to form interdigitated runner array 130. Further, in extending beneath and across source manifold 138 along the lateral axis of FET layout 124 (corresponding to the Y-axis of coordinate legend 28), gate runners 140 are vertically spaced from source manifold 138 by a vertical offset or gap (filled with dielectric) to provide the requisite electrical isolation. This, in effect, forms a cross-over structure or topology to provide electrical contact to the source and gate regions of FET IC 48 without undesired bridging or cross-coupling of the source and gate currents.

Figure 8:
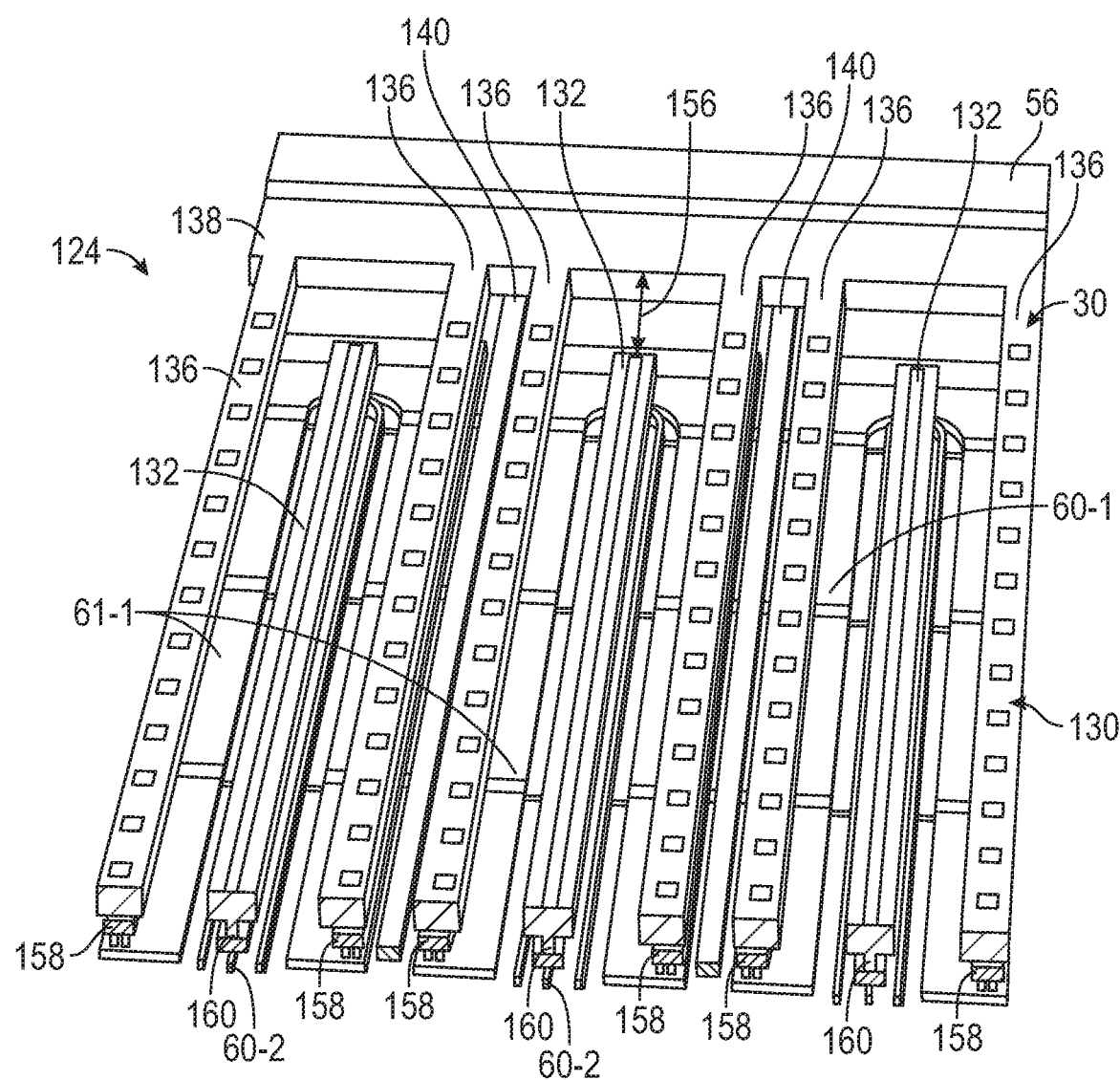
Figure 9:
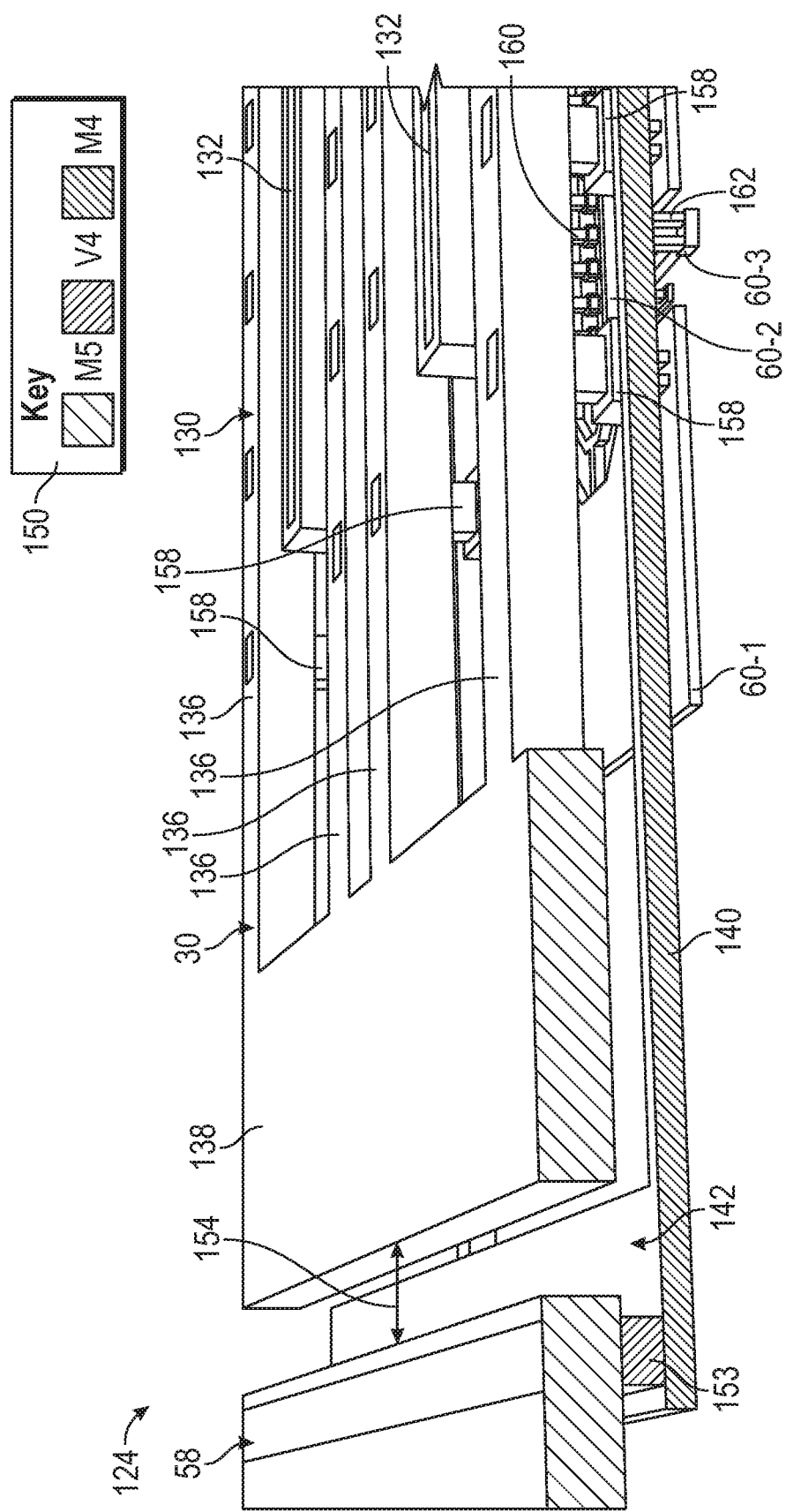

The above-described cross-over topology may be more fully appreciated by referring to in FIG. 9, which further includes a key 150 identifying the portions of the patterned metal layers shown in cross-section. As can be seen in this drawing figure, gate bond pad 56 (formed in the patterned M5 layer) is electrically coupled to gate manifold 142 (formed in the patterned M4 layer) by one or more (e.g., bar shaped) vias or metal plugs 153 extending between the M4 and M5 layers. Concurrently, a lateral isolation gap 154 is provided between gate bond pad 56 (formed in the patterned M5 layer in the illustrated example) and source manifold 138 (also formed in the patterned M5 layer) to provide the requisite electrical isolation between these structures. Similarly, as shown in FIGS. 8 and 9, drain runners 132 extend from drain manifold 134 toward source manifold 138, while terminating prior to reaching source manifold 138. Additional isolation gaps are thus formed at this interface, as indicated in FIG. 8 by arrow 156, to provide appropriate electrical isolation between drain runners 132 and source manifold 138. Finally, source runners 136 likewise extend from source manifold 138 toward drain manifold 134 and drain bond pad 58, while terminating prior to reaching drain manifold 134 to provide the desired electrical isolation between these structures. In further embodiments, frontside layer system 30 may be produced to provide the desired interconnections with FET IC 48 in another manner; e.g., the conductive source structures may be formed in lower patterned metal layers (that is, metal layers located closer to frontside 24 of die body 22) to extend beneath the conductive drain structures. Thus, in embodiments, FET layout 124 may be formed such that gate runners 140 pass either beneath or above source manifold 138 in extending from gate manifold 142 to locations overlying the active regions of the transistor.

As discussed above, source runners 136 (here, formed in the patterned M5 layer) and drain runners 132 (likewise formed in the patterned M5 layer) are interdigitated or interleaved in the illustrated example to form interdigitated transistor array 130. In an example topology, each drain runner 132 may be disposed between two adjacent source runners 136, as taken along the longitudinal axis of FET layout 124 (corresponding to the X-axis of coordinate legend 28). This structural pattern is then repeated along the longitudinal axis of FET layout 124 (X-axis) to form interdigitated transistor array 130, as previously described. Although formed in a lower patterned metal layer (here, the patterned M4 layer) in the illustrated example, gate runners 140 are similarly disposed between laterally adjacent pairs of source runners 136, as seen looking downwardly onto frontside layer system 30 along a vertical axis or the centerline of RF power die 20 (orthogonal to frontside 24 of die body 22 corresponding to the Z-axis of coordinate legend 28). Progressing from left to right along the X-axis of coordinate legend 28 (along which gate bond pad 56, gate manifold 142, source manifold 138, drain bond pad 58, and drain manifold 134 extend in parallel), a first source runner 136 is encountered, followed by a drain runner 132, followed by a second source runner 136, followed by a gate runner 140, with this pattern then repeating along the length of the FET and interdigitated transistor array 130. In other implementations, different FET layouts may be provided, with the present embodiment providing one suitable example.

Electrical contact is provided to the various active regions of the FET (included in active transistor regions 42, 44, 46 shown in FIG. 1) through a number of patterned metal features formed in the innermost (M1) patterned metal layer of frontside layer system 30. For example, and as best shown in FIGS. 8 and 9, various patterned metal regions or features 44-1 may contact the drain and source regions of the FET (commonly referred to as the "drain contacts" and "source metal"). Electrical interconnection is provided between source metal features 44-1 and source runners 136 through electrically-conductive vias, metal plugs, or similar interconnect structures (generally labeled as "158" in FIGS. 8 and 9). Such vias or plugs 158 are formed between the intermediate (M2-M4) patterned metal layers and extend vertically from the underside of source runners 136 to provide electrical connection to the various patterned regions of source metal features 44-1 formed in the patterned M1 layer. Similarly, electrically-conductive vias or vertical plugs 160 are formed between the intermediate (M2-M4) patterned metal layers to electrically connect drain runners 132 to corresponding patterned regions 44-2 of the patterned M1 layer, which contact the doped drain regions of the FET. Finally, as labeled in FIG. 9, electrically-conductive vias or vertical plugs 162 are likewise provided between the patterned metal layers to electrically connect gate runners 140 to the appropriate patterned regions 44-3 of the M1 metal layer and gate contacts that overlie the channel regions. In this manner, the patterned metal features and conductive vias formed in frontside layer system 30 complete the FET structure, which provide electrical interconnection between the gate, source, and drain terminals of the FET IC to corresponding bond pads (gate bond pad 56, source bond pads 54, and drain bond pad 58) accessible for interconnection along frontside I/O interface 38 of RF power die 20.

There has thus been provided an RF power die (e.g., RF power die 20) having a flip-chip architecture. The flip-chip architecture of RF power die 20 is enabled by the provision of a frontside I/O interface (e.g., frontside I/O interface 38), modified transistor layouts or topologies (e.g., FET layout 124), and unique frontside layer system routing schemes, as previously discussed. In the above-described example in which RF power die 20 contains a FET IC, the wiring or routing topology formed in frontside layers 30 include the formation of branched source electrodes (e.g., source manifold 138 and source runners 136) providing frontside electrical connection between at least one frontside source bond pad (e.g., source pads 40) and the doped source region(s) of the FET IC. So too may the frontside layer system contain at least one branched drain electrode (e.g., drain manifold 134 and drain runners 132) and at least one branched gate electrode (e.g., gate manifold 142 and gate runners 140) to provide electrical interconnections between gate bond pad 56 and drain bond pad 58, respectively, and the corresponding active regions of the FET. By providing all transistor I/O connections through I/O interface 38, RF power die 20 may be produced to lack TSVs to allow reductions in manufacturing costs, shrunk die sizes, and reduce susceptibility to die cracking. Additionally, due to the positioning of source runners 136 relative to drain runners 132 and gate runners 140, additional isolation or shielding may be provided to improve RF power die performance. In further embodiments, RF power die 20 can achieve such benefits, while incorporating other FET layouts that differ relative to FET layout 124 in varying respects. To further emphasize this point, additional description of two alternative FET layouts suitable for incorporation into RF power dies having flip-chip architectures will now be described in connection with FIGS. 10 and 11.

Additional Example FET Layouts Supporting Flip-Chip Architectures

Figure 10:
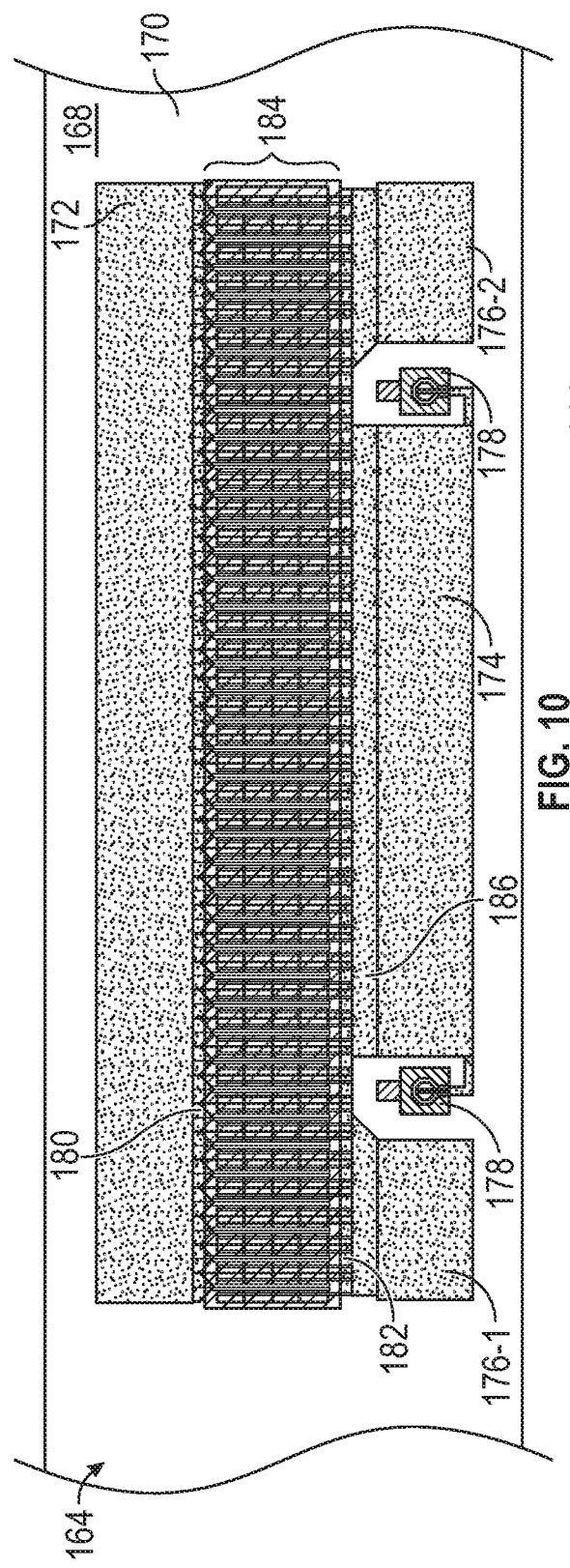
FIGS. 10 and 11 are second and third planform views, respectively, of transistor layouts (again, field effect transistor structures) suitably integrated into RF power dies having flip-chip architectures, as illustrated in accordance with further example embodiments of the present disclosure.
Figure 11:
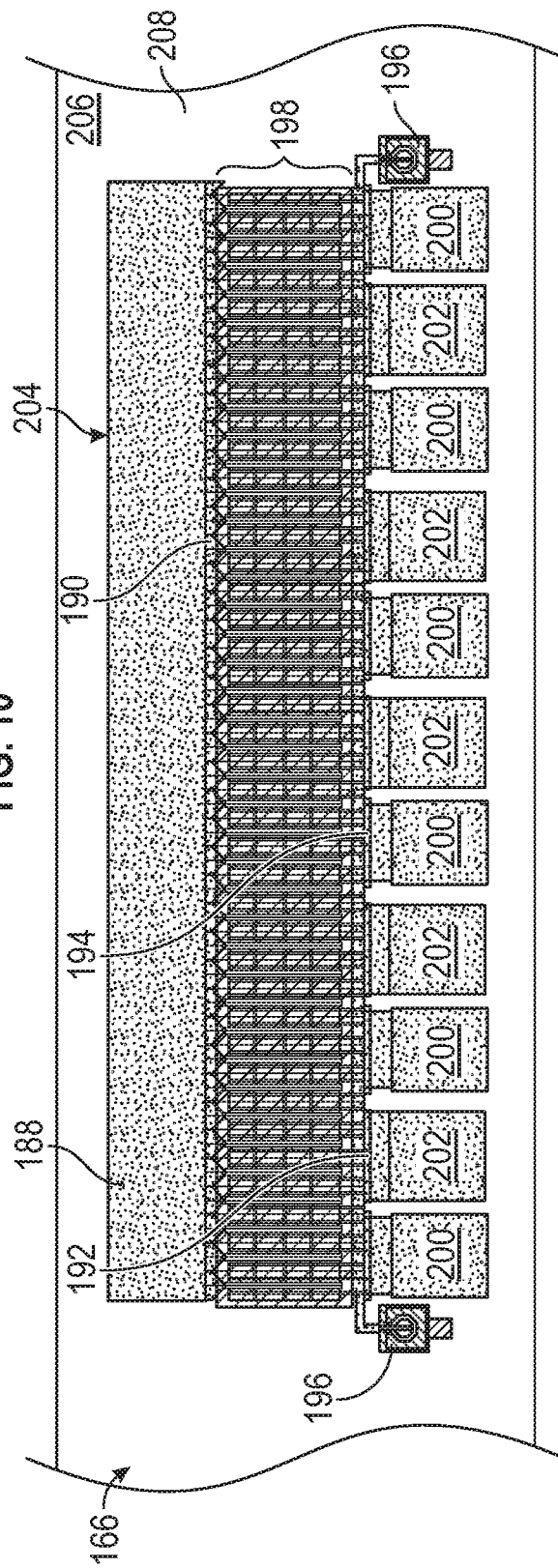

Turning now to FIGS. 10 and 11, additional example embodiments of FET topologies, structures, or layouts 164, 166 are presented. FET layouts 164, 166 are well-suited for integration into a flip-chip RF power die (e.g., RF power die 20 shown in FIG. 1) and support frontside I/O interfaces similar or identical to frontside I/O interface 38. Addressing first FET layout 164 shown in FIG. 10, FET layout 164 is formed in and above a body of semiconductor material 170, which may form a part or the entirety of a die body having a frontside 168 (corresponding to frontside 24 of die body 22 shown in FIG. 1). As previously described, certain regions of semiconductor material 170 are doped to define the source and drain regions of FET layout 164; e.g., as seen looking downwardly onto the principal surface of the semiconductor region in which the channel of FET layout 164 is formed, each source region is located between two drain regions, with two channel regions (and overlying gate structures) located between the source region and the two drain regions. In a manner similar to FET layout 124 described above in connection with FIGS. 5-9, the I/O interface of FET layout 164 includes an elongated drain bond pad 172, an elongated gate bond pad 174, and two source bond pads 176-1, 176-2. Additionally, in the illustrated example, gate bias bond pads 178 are also provided in the frontside I/O interface. Drain bond pad 172 is electrically coupled to a branched drain electrode, which includes a drain manifold 180 from which a plurality of elongated drain fingers or runners extends. Similarly, source bond pads 176 are electrically connected to opposing ends of a source manifold 182, which extends parallel to drain manifold 180 in a manner analogous to that previously described. A plurality of source runners extends from source manifold 182 and cooperates with the drain runners to form an interdigitated transistor array 184. Finally, gate bond pad 174 is electrically coupled to an underlying gate manifold 186 from which gate runners extend, with the gate runners formed in one or more patterned metal layers (e.g., the M3 or M4 layer) beneath the patterned metal layer in which source manifold 182 is formed (e.g., the M5 layer) to allow the gate runners to extend beneath source manifold 182 and into interdigitated transistor array 184 in the manner previously described.

Similarly, in the example of FIG. 11, another possible FET layout 166 supportive of a frontside I/O interface similar or identical to frontside I/O interface 38 is presented. Once again, FET layout 166 includes a frontside I/O interface containing an elongated drain bond pad 188, an elongated drain manifold 190, an elongated source manifold 192, an elongated gate manifold 194, and gate bias bond pads 196. Drain runners extend from drain manifold 190 (collectively, a "branched drain electrode"), source runners extend from source manifold 192 (collectively, a "branched source electrode"), and gate runner extend from gate manifold 194 (collectively, a "branched gate electrode") to produce an interdigitated transistor array 198. However, in contrast to FET layout 164, FET layout 166 contains a plurality of gate bond pads 200 (each electrically coupled to gate manifold 194) and a plurality of source bond pads 202 (each electrically coupled to source manifold 192). Gate bond pads 200 and source bond pads 202 are interspersed or interleaved in an alternating pattern or relationship, as taken along the longitudinal axis of FET layout 166. In other implementations, source bond pads 202 may instead be interleaved with drain bond pad 188 in a similar, with drain bond pad 188 divided into a number of discrete portions or regions along its length in a manner analogous to gate bond pads 200; or, as a further possibility, source bond pads 202 may be interleaved with both a plurality of gate bond pads and a plurality of drain bond pads in an alternating relationship akin to that shown in FIG. 11. Accordingly, the RF power die into which such a FET layout or topology is integrated may be described as containing at least one of: (i) a plurality of a source bond pads interleaved with a plurality of gate bond pads in an alternating relationship; and/or (ii) a plurality of drain bond pads likewise interleaved with the plurality of gate bond pads in an alternating relationship.

The above-described electrically-conductive features or "transistor wiring structure" may be formed by patterning the metal layers included in a frontside layer system 204, which is formed on a frontside or upper principal surface 206 of a body of semiconductor material 208. Prior to deposition of the patterned metal layers and intervening dielectric layers, the appropriate regions of semiconductor material body 208 are doped to define the source and drain regions of FET structure 166 in a manner analogous to that previously described. Compared to FET layout 124 (FIGS. 5-9) and FET layout 164 (FIG. 10), FET layout 166 is well-suited for incorporation into a larger die and may reduce source inductance due to the proximity of source bond pads 202 to source manifold 192 along the length of the source manifold. Due to reduced inductive and resistive losses, FET layout 166 may be beneficially employed in higher frequency applications. Conversely, relative to FET layout 166, FET layouts 124, 164 may be well-suited for usage in lower frequency applications and more readily produced due to the relatively large size of the gate bond pad, which may also increase the current-carrying capabilities of the transistor. In each of example FET layouts, a relatively compact FET layout is achieved supporting the formation of a frontside I/O interface in the manner previously described.

Alternative Embodiments of a PAM Containing at Least One Flip-Chip RF Power Die

Figure 12:
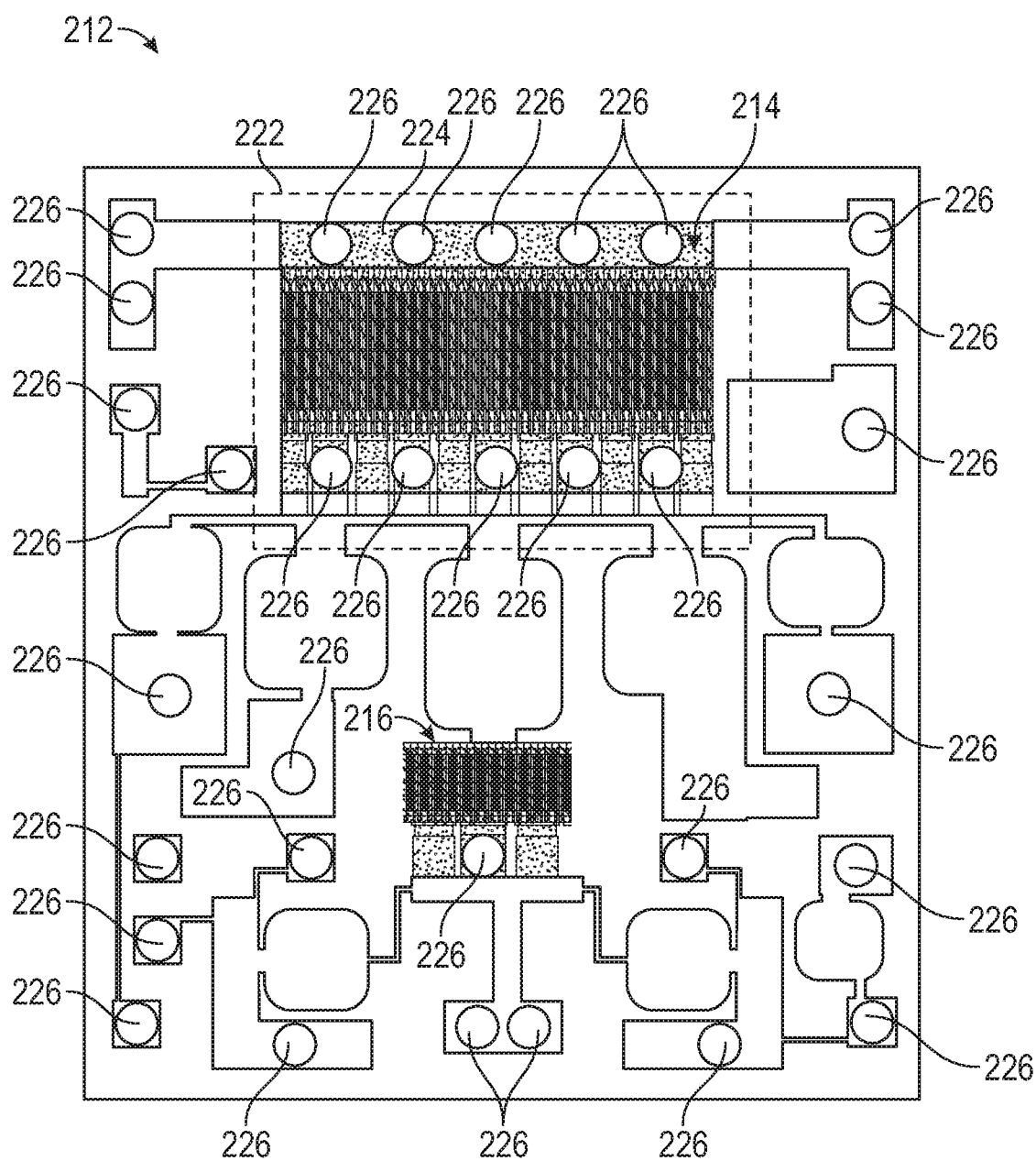
FIG. 12 is a planform view of a multi-stage power amplifier integrated circuit suitably incorporated into a PAM containing at least one RF power die having a flip-chip architecture in additional implementations of the present disclosure.

In the above described example embodiment discussed in connection with FIGS. 2-4, PAM 70 assumes a relatively simple form and contains a single illustrated RF power die (RF power die 20). In further embodiments, PAMs produced in accordance with the present teachings can be considerably more complex, providing that the PAM includes at least one RF power die and a thermal interface through which heat generated by the die (and any number of other microelectronic components within the PAM) can be extracted. For example, in certain embodiments, PAM 70 may contain both peaking and carrier amplifier dies utilized in a Doherty power amplifier IC, which are attached to an amplifier module substrate. In addition, either or both of the peaking and carrier amplifier dies may embody a single stage amplifier, as described previously, or a multiple-stage amplifier. In still other instances, multi-transistor amplifier stages, and various other circuitry, may be formed on a single RF power die. Further emphasizing this point, FIG. 12 is a top-down or planform view of a dual stage power amplifier IC 212, which is formed on a single RF power die and which is suitable for integration into a PAM of the type described herein. In this example, the dual stage power amplifier IC 212 includes a primary or pre-amplifier transistor stage 214, a secondary or final amplifier transistor stage 216, and various other electronic components (only a few of which are labeled for clarity), such as shunt capacitors and bias circuitry. One or more thermal extensions (hidden from view in FIG. 12, but generally represented by phantom line 222) have previously been bonded to the backside of the dual stage power amplifier IC 212 that includes transistor stages 214, 216. In the illustrated example, specifically, a single thermal extension 222 is illustrated as positioned over primary transistor stage 214; e.g., this transistor stage 214 may be particularly susceptible to excess heat generation and accumulation and, thus, targeted for enhanced heat removal through thermal extension 222.

To integrate dual stage power amplifier IC 212 into a PAM having a frontside thermal interface, various contact extensions 226 (e.g. solder bumps or balls) may be deposited over the appropriate terminal or contacts of dual stage power amplifier IC 212; e.g., the second stage drain bond pad(s), the first and second stage source bond pads, the first stage gate bond pad(s), gate and drain bias pads, and the shunt capacitors, to list but a few examples. With respect to shunt capacitors, in particular, the uppermost metal terminal or "top plate" may be connected to ground via such contact extensions 226 when the RF power die carrying dual stage power amplifier IC 212 is integrated into a PAM and ultimately installed in a larger electronic system or assembly. During assembly, the RF power die carrying dual stage power amplifier IC 212 may be inverted and mounted (physically joined and electrically interconnected) with a module substrate, such as a PCB. The resulting assembly may be overmolded to form a molded module body having an excessive thickness and fully covering thermal extension 222, in at least some instances. The molded module body may then be thinned by back-grinding to reveal the upper surface of thermal extension 222 from the top surface of the PAM. Finally, and any additional steps may then be performed, as needed, to complete fabrication of the resulting PAM.

CONCLUSION

There has thus been provided RF power dies having flip-chip architectures and PAMs containing flip-chip RF power dies. In a given PAM, at least one RF power die is mounted to the module substrate in an inverted orientation such that the frontside of the RF power die faces the die support surface of the substrate. Electrical signals may be routed and power supplied to the RF power die vertically through a module substrate to which the RF power die is mounted, along with any number of additional components. Additionally, certain embodiments, the PAMs allow the efficient extraction from excess heat, as generated by at least one RF power die contained in the PAM, through the top surface of the PAM. More generally, embodiments of RF power dies having flip-chip architectures and unique frontside I/O interfaces have been provided. Embodiments of the flip-chip RF power die are beneficially (although non-essentially) produced to lack TSVs to lower manufacturing costs and complexity, reduce die size, and provide increased structural robustness.

In embodiments, a PAM includes a module substrate having a die support surface and a plurality of conductive contacts exposed at the die support surface. A first RF power die is mounted to the die support surface of the module substrate in an inverted orientation. The first RF power die includes, in turn, a die body having a frontside and an opposing backside, a transistor having active regions formed in the die body, and a frontside layer system formed over the frontside of the die body. The frontside layer system contains patterned metal layers defining first, second, and third branched electrode structures electrically coupled to the active regions of the transistor. A frontside I/O interface is formed in an outer terminal portion of the frontside layer system, with the frontside I/O interface containing first, second, and third bond pads. The first, second, and third bond pads are electrically coupled to the first, second, and third branched electrode structures, respectively, while the third bond pad is further electrically coupled to the plurality of conductive contacts of the module substrate.

In further embodiments a PAM includes a module substrate having a die support surface, as well as an RF power die mounted to the die support surface of the module substrate in an inverted orientation with a contact surface of the RF power die facing the die support surface. The RF power die includes a die body having a frontside and an opposing backside. A frontside layer system is formed over the frontside of the die body and defines the contact surface of the RF power die. A FET, formed in the die body and in the frontside layer system, includes a branched drain electrode structure, a branched gate electrode structure, and a branched source electrode structure. A frontside I/O interface is further formed in an outer terminal portion of the frontside layer system. The frontside I/O interface includes a first drain bond pad, a first gate bond pad, and a first source bond pad electrically coupled to the branched drain electrode structure, to the branched gate electrode structure, and to the branched source electrode structure, respectively.

As further disclosed herein, embodiments of an RF power die include a die body having a frontside and an opposing backside, a frontside layer system formed over the frontside of the die body, and a FET formed in the die body and in the frontside layer system. The FET includes a branched drain electrode structure, a branched gate electrode structure, and a branched source electrode structure. Further formed in an outer terminal portion of the frontside layer system, a frontside I/O interface includes a first drain bond pad electrically coupled to the branched drain electrode structure, a first gate bond pad electrically coupled to the branched gate electrode structure, and a first source bond pad electrically coupled to the branched source electrode structure.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A power amplifier module (PAM), comprising:
    a module substrate having a die support surface and a plurality of conductive contacts exposed at the die support surface; and
    a first radio frequency (RF) power die mounted to the die support surface of the module substrate in an inverted orientation, the first RF power die comprising:
        a die body having a frontside and an opposing backside, at least a portion of the die body composed of a high resistivity semiconductor material having an electrical resistance exceeding 520 ohms per centimeter;
        a transistor having active regions formed in the die body;
        a frontside layer system formed over the frontside of the die body and containing patterned metal layers defining first, second, and third branched electrode structures electrically coupled to the active regions of the transistor; and
        a frontside input/output (I/O) interface formed in an outer terminal portion of the frontside layer system, the frontside I/O interface containing first, second, and third bond pads;
    wherein the first, second, and third bond pads are electrically coupled to the first, second, and third branched electrode structures, respectively, while the third bond pad is further electrically coupled to the plurality of conductive contacts of the module substrate.

2. The PAM of claim 1, wherein the first RF power die comprises a field effect transistor (FET);
    wherein the first, second, and third branched electrode structures comprise branched drain, gate, and source electrode structures, respectively; and
    wherein the first, second, and third bond pads comprise drain, gate, and source bond pads, respectively.

3. The PAM of claim 2, wherein the branched source electrode structure comprises:
    a plurality of source runners; and
    a source manifold from which the plurality of source runners extend, the source manifold electrically coupled between the plurality of source runners and the source bond pad.

4. The PAM of claim 3, wherein the branched drain electrode structure comprises:
    a plurality of drain runners interleaved with the plurality of source runners; and
    a drain manifold from which the plurality of drain runners extend, the drain manifold electrically coupled between the plurality of drain runners and the drain bond pad.

5. The PAM of claim 4, wherein the branched gate electrode structure comprises:
    a plurality of gate runners extending substantially parallel to the plurality of source runners; and
    a gate manifold from which the plurality of gate runners extend, the gate manifold electrically coupled between the plurality of gate runners and the gate bond pad.

6. The PAM of claim 5, wherein, in extending from the gate manifold to locations overlying the active regions of the transistor, the plurality of gate runners passes beneath or above the source manifold.

7. The PAM of claim 5, wherein the gate manifold and the drain manifold are formed at different levels in the frontside layer system.

8. The PAM of claim 5, wherein the frontside layer system comprises:
    a first patterned metal layer in which the gate bond pad, the source manifold, and the plurality of source runners are formed; and
    a second patterned metal layer in which the gate manifold and the plurality of gate runners are formed.

9. The PAM of claim 1, wherein the RF power die further comprises a backmetal structure formed over the backside of the die body, the backmetal structure electrically isolated from the active regions of the transistor; and
    wherein the die body is free of through substrate vias.

10. The PAM of claim 1, wherein the RF power die further comprises a backmetal structure formed over the backside of the die body; and
    wherein the PAM further comprises:
        an overmold body bonded to the die support surface and at least partially encapsulating the first RF power die; and
        a thermal extension embedded within the overmold body, thermally coupled to the backmetal structure, and extending from a location adjacent the backmetal structure to an outer top surface of the overmold body.

11. A power amplifier module (PAM), comprising:
a module substrate having a die support surface; and
a radio frequency (RF) power die mounted to the die support surface of the module substrate in an inverted orientation with a contact surface of the RF power die facing the die support surface, the RF power die comprising:
  a die body having a frontside and an opposing backside;
  a frontside layer system formed over the frontside of the die body, and defining the contact surface of the RF power die;
  a field effect transistor (FET) formed in the die body and in the frontside layer system, the FET comprising a branched drain electrode structure, a branched gate electrode structure, and a branched source electrode structure; and
  a frontside input/output (I/O) interface further formed in an outer terminal portion of the frontside layer system, the frontside I/O interface comprising:
    a drain bond pad electrically coupled to the branched drain electrode structure;
    a plurality of gate bond pads electrically coupled to the branched gate electrode structure;
    a first source bond pad electrically coupled to the branched source electrode structure; and
    at least one of: (i) a plurality of a source bond pads including the first source bond pad and interleaved with the plurality of gate bond pads in an alternating relationship; and (ii) a plurality of drain bond pads including the first drain bond pad and interleaved with the plurality of gate bond pads in an alternating relationship.

12. The PAM of claim 11, wherein the branched source electrode structure comprises:
  a plurality of source runners extending substantially parallel to a first axis; and
  a source manifold from which the plurality of source runners extends, the source manifold electrically coupled between the plurality of source runners and the first source bond pad.

13. The PAM of claim 12, wherein the source manifold is located adjacent the first gate bond pad, while being spaced therefrom by an isolation gap as taken along the first axis.

14. The PAM of claim 12, wherein the branched gate electrode structure comprises:
  a gate manifold located closer to the frontside of the die body than is the first gate bond pad; and
  a plurality of gate runners extending from the gate manifold, underneath the source manifold, and across active regions of the FET.

15. The PAM of claim 12, wherein the first source bond pad is located adjacent a first side of the source manifold; and
  wherein the RF power die further comprises a second source bond pad located adjacent a second side of the source manifold opposite the first side of the source manifold, as taken along a second axis perpendicular to the first axis.

16. The PAM of claim 11, wherein the RF power die further comprises a backmetal structure formed over the backside of the die body; and
  wherein the PAM further comprises:
    an overmold body bonded to the die support surface and at least partially encapsulating the RF power die; and
    a thermal extension embedded within the overmold body, thermally coupled to the backmetal structure, and extending from a location adjacent the backmetal structure to an outer top surface of the overmold body.

17. A radio frequency (RF) power die, comprising:
  a die body having a frontside and an opposing backside, the die body at least partially composed of a high resistivity semiconductor material having an electrical resistance exceeding 520 ohms per centimeter;
  a frontside layer system formed over the frontside of the die body;
  a field effect transistor (FET) formed in the die body and in the frontside layer system, the FET comprising:
    a branched drain electrode structure;
    a branched gate electrode structure;
    a branched source electrode structure; and
  a frontside input/output (I/O) interface further formed in an outer terminal portion of the frontside layer system, the frontside I/O interface comprising:
    a first drain bond pad electrically coupled to the branched drain electrode structure;
    a first gate bond pad electrically coupled to the branched gate electrode structure; and
    a first source bond pad electrically coupled to the branched source electrode structure.

18. The RF power die of claim 17, wherein the die body is free of through substrate vias.

19. The RF power die of claim 17, wherein the branched source electrode structure comprises:
  a plurality of source runners; and
  a source manifold from which the plurality of source runners extend, the source manifold electrically coupled between the plurality of source runners and the first source bond pad.

20. The RF power die of claim 19, wherein the branched drain electrode structure comprises:
  a plurality of drain runners interleaved with the plurality of source runners; and
  a drain manifold from which the plurality of drain runners extend, the drain manifold electrically coupled between the plurality of drain runners and the first drain bond pad.

* * * * *